(12) United States Patent
Unami et al.

(10) Patent No.: US 6,903,498 B2
(45) Date of Patent: Jun. 7, 2005

(54) PIEZOELECTRIC DEVICE, LADDER TYPE FILTER, AND METHOD OF PRODUCING THE PIEZOELECTRIC DEVICE

(75) Inventors: Toshihiko Unami, Omihachiman (JP); Jiro Inoue, Omihachiman (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 131 days.

(21) Appl. No.: 10/216,377

(22) Filed: Aug. 12, 2002

(65) Prior Publication Data

US 2003/0042820 A1 Mar. 6, 2003

(30) Foreign Application Priority Data

Aug. 28, 2001 (JP) .................................. 2001-258240

(51) Int. Cl.[7] ............................................. H01L 41/08
(52) U.S. Cl. ........................ 310/366; 310/328; 310/332
(58) Field of Search ................................ 310/328, 359, 310/366, 330, 332

(56) References Cited

U.S. PATENT DOCUMENTS

| | | | | |
|---|---|---|---|---|
| 4,639,630 A | * | 1/1987 | Rodloff et al. .............. | 310/328 |
| 5,001,681 A | * | 3/1991 | Bertoldi et al. .............. | 367/160 |
| 5,225,731 A | * | 7/1993 | Owen .......................... | 310/366 |
| 5,345,137 A | * | 9/1994 | Funakubo et al. ..... | 310/323.16 |
| 5,925,971 A | * | 7/1999 | Unami ........................ | 310/328 |
| 6,066,911 A | * | 5/2000 | Lindemann et al. ... | 310/323.02 |
| 6,091,180 A | * | 7/2000 | Unami et al. ................ | 310/328 |
| 6,111,480 A | * | 8/2000 | Iyama et al. ................. | 333/188 |
| 6,114,798 A | * | 9/2000 | Maruyama et al. ..... | 310/323.06 |

FOREIGN PATENT DOCUMENTS

| | | |
|---|---|---|
| JP | 3-123088 | 5/1991 |
| JP | 10-4330 | 1/1998 |
| JP | 10-51261 | 2/1998 |

* cited by examiner

*Primary Examiner*—Mark Budd
(74) *Attorney, Agent, or Firm*—Keating & Bennett, LLP

(57) ABSTRACT

A lamination type piezoelectric device includes a piezoelectric member that is longer in one direction, and a plurality of internal electrodes extending substantially perpendicularly to the longitudinal direction and arranged so as to be opposed to each other via piezoelectric layers, respectively. Bending vibration in which the piezoelectric member is bent substantially perpendicularly to the longitudinal direction thereof is excited using a piezoelectric longitudinal effect.

14 Claims, 20 Drawing Sheets

PIEZOELECTRIC DEVICE, LADDER TYPE FILTER, AND METHOD OF PRODUCING THE PIEZOELECTRIC DEVICE

BACKGROUND OF THE INVENTION

1. Field of the Invention

The present invention relates to a piezoelectric device for use in a resonator filter, an actuator, or other suitable apparatus, and a method of producing the same, and more particularly to a piezoelectric device operable to excite bending vibration in the longitudinal direction utilizing a piezoelectric longitudinal effect.

2. Description of the Related Art

There have been proposed different types of piezoelectric devices utilizing a piezoelectric longitudinal effect and those utilizing a piezoelectric transverse effect as piezoelectric resonators and piezoelectric actuators. When an electric field is applied to a piezoelectric member in the same direction as the polarization direction, the piezoelectric longitudinal effect makes use of the displacement of the piezoelectric member in which the piezoelectric member is expanded and contracted in the longitudinal direction, that is, in the direction of the piezoelectric member to which the electric field is applied. The piezoelectric transverse effect makes use of the displacement in which a piezoelectric member is expanded and contracted substantially perpendicularly to the direction in which an electric field is applied, that is, in the transverse direction of the piezoelectric member.

As piezoelectric resonators which are operable in several hundred kHz bands, resonators which carry out radial vibration utilizing a piezoelectric transverse effect or length expanding/contracting vibration have been widely used. In the case of a piezoelectric resonator utilizing the extending vibration, the displacement is used which is generated when an electric field is applied in the thickness direction of a square piezoelectric plate, so that the piezoelectric plate is expanded and contracted in the diameter direction. Moreover, in the case of a piezoelectric resonator utilizing the length expanding/contracting vibration, an electric field is applied to a rod-shaped piezoelectric member polarized only in the thickness direction, in the polarization direction of the piezoelectric member, and thereby, the piezoelectric member is expanded and contracted in the longitudinal direction.

Japanese Unexamined Patent Application Publication No. 10-4330 discloses a lamination type piezoelectric resonator which is operable to excite length expanding/contracting vibration utilizing a piezoelectric longitudinal effect. In this case, a plurality of internal electrodes are arranged substantially perpendicularly to the longitudinal direction in a piezoelectric member which is longer in one direction. Adjacent piezoelectric layers in the longitudinal direction via the internal electrode are polarized 180° out-of-phase with each other in the longitudinal direction. In the piezoelectric resonator, a voltage is applied to the respective piezoelectric members, and thereby, the piezoelectric member is expanding/contracting-vibrated in the longitudinal direction.

According to the piezoelectric resonator which is operable to excite the length expanding/contracting vibration utilizing the above-described piezoelectric longitudinal effect, the band width can be increased compared to a prior art piezoelectric resonator using the piezoelectric transverse effect. Moreover, the piezoelectric resonator utilizing the longitudinal effect has a lamination structure, and therefore, can be constructed so as to have different electrostatic capacitances. Moreover, the piezoelectric resonator utilizing the piezoelectric longitudinal effect can be reduced in size compared to the piezoelectric resonator utilizing the piezoelectric transverse effect.

The size of the piezoelectric resonator utilizing the piezoelectric longitudinal effect can be reduced compared to that of the piezoelectric resonator utilizing the piezoelectric transverse effect, as described above. However, the resonance frequency of the piezoelectric device depends on the length thereof. Thus, to realize a piezoelectric device having a desired resonance frequency, the device must be set to have a predetermined length. Accordingly, the length of the device can not be still more reduced. That is, in the case of the piezoelectric resonator utilizing length expanding/contracting vibration due to the piezoelectric longitudinal effect, the size can not be more reduced.

SUMMARY OF THE INVENTION

In order to overcome the problems described above, preferred embodiments of the present invention provide a piezoelectric device of which the length of one half of the region being substantially parallel to the longitudinal direction of its columnar member can be changed, and the length can be still more reduced, and to provide a method of manufacturing such a novel piezoelectric device.

According to a first preferred embodiment of the present invention, a piezoelectric device which is a lamination type piezoelectric device, includes a piezoelectric member having a first end surface and a second end surface arranged on both ends in the longitudinal direction thereof, an upper surface and a lower surface each extending between the first end surface and the second end surface, and a first side surface and a second side surface, and a plurality of internal electrodes extending substantially perpendicularly to the longitudinal direction in the piezoelectric member and being arranged so as to be opposed to each other via piezoelectric layers in the longitudinal direction of the piezoelectric member, respectively, whereby the device can be operated to excite bending vibration utilizing a piezoelectric longitudinal effect in which the piezoelectric member is bent substantially perpendicularly to the longitudinal direction thereof.

With the piezoelectric device according to the first preferred embodiment of the present invention, bending vibration substantially perpendicular to the longitudinal direction of the piezoelectric member is excited by use of a piezoelectric longitudinal effect.

In this description, it should be understood that the piezoelectric device includes a piezoelectric actuator or other suitable apparatus, in addition to piezoelectric resonator devices such as a piezoelectric resonator, a piezoelectric filter, and so forth.

As described above, the piezoelectric device according to the first preferred embodiment of the present invention is operated to excite bending vibration substantially perpendicular to the longitudinal direction of the piezoelectric member utilizing the piezoelectric longitudinal effect. Thus, when the piezoelectric device is used as a resonance device, the bandwidth is greatly increased. Moreover, the electrostatic capacity can be realized in a wide range thereof, and also, the length of the device is even more reduced. When the piezoelectric device according to this preferred embodiment of the present invention is used as a piezoelectric actuator, the length of the device can be also reduced.

According to a second preferred embodiment of the present invention, a piezoelectric device which is a bimorph type piezoelectric device includes a piezoelectric member having a first end surface and a second end surface arranged on both ends in the longitudinal direction thereof, an upper surface and a lower surface each extending between the first end surface and the second end surface, and a first side surface and a second side surface, a plurality of the first internal electrodes and a plurality of the second internal electrodes being arranged substantially perpendicular to the longitudinal direction of the piezoelectric member, being overlapped with each other via piezoelectric layers in the longitudinal direction, respectively, and being alternately arranged in the longitudinal direction, each of the first internal electrodes having a first divided internal electrode and a second divided internal electrode divided substantially perpendicular to the longitudinal direction of the piezoelectric member, the piezoelectric member having a first piezoelectric region lying on the first side surface side or on the upper surface side and a second piezoelectric region lying on the second side surface side or on the lower surface side with respect to the center of the width direction of the piezoelectric member, the first and second piezoelectric regions being configured so that expanding/contracting driving-forces are generated 180° out-of-phase with each other, utilizing a piezoelectric longitudinal effect, whereby the bending vibration in which the entire portion extending in the longitudinal direction of the piezoelectric member is bent substantially perpendicularly to the longitudinal direction of the piezoelectric member.

Preferably, piezoelectric layers of the piezoelectric member which are adjacent in the longitudinal direction are polarized in the longitudinal direction of the piezoelectric member and in different polarization directions, the first piezoelectric region and the second piezoelectric region are polarized in the same polarization direction in each of the piezoelectric layers, and electric fields are applied to the first piezoelectric region and the second piezoelectric region in different electric-field directions.

More preferably, the device further includes first and second external electrodes which are disposed on the outer surface of the piezoelectric member so as to be electrically connected to the first and second divided internal electrodes.

Also, preferably, the first and second external electrodes are disposed on the upper surface or the lower surface of the piezoelectric member.

More preferably, the device further includes a groove disposed between the first and second external electrodes.

More preferably, the first piezoelectric region and the second piezoelectric region of each piezoelectric layer are polarized in the opposite polarization directions in the longitudinal direction of the piezoelectric member, and the corresponding piezoelectric regions of piezoelectric layers of the piezoelectric member which are adjacent in the longitudinal direction thereof are polarized in the opposite polarization directions, whereby electric fields in the same direction are applied to the first piezoelectric region and the second piezoelectric region of each piezoelectric layer.

Preferably, the device further includes a first external electrode disposed on the outer surface of the piezoelectric member so as to be electrically connected to the first internal electrodes, and a second internal electrode disposed on the outer surface of the piezoelectric member so as to be electrically connected to the second internal electrodes.

Preferably, each of the first and second internal electrodes has a first divided internal electrode arranged in the fist piezoelectric region and the second divided internal electrode arranged in the second piezoelectric region, the first and second divided internal electrodes being electrically connected to each other. The electrical conduction of the first and second divided internal electrodes may be achieved by use of an external electrode or an external relay electrode disposed on the outer surface of the piezoelectric member.

According to a third preferred embodiment of the present invention, a piezoelectric device which is a unimorph type piezoelectric device includes a piezoelectric member having a first end surface and a second end surface arranged on both ends in the longitudinal direction thereof, an upper surface and a lower surface each extending between the first end surface and the second end surface, and a first side surface and a second side surface, a plurality of the first internal electrodes and a plurality of the second internal electrodes being arranged substantially perpendicularly to the longitudinal direction in the piezoelectric member, and being arranged so as to be overlapped with each other via piezoelectric layers in the longitudinal direction, respectively, pairs of the piezoelectric layers which are adjacent in the longitudinal direction being polarized in the opposite polarization directions, the first internal electrode and the second internal electrode being arranged so as to be unevenly distributed on the side surface side, on the upper surface side, or on the lower surface side, the piezoelectric region having the first and second internal electrodes disposed therein being configured so as to generate expanding/contracting drive forces in the longitudinal direction utilizing a piezoelectric longitudinal effect, whereby the bending vibration in which an entire portion in the longitudinal direction of the piezoelectric member is bent substantially perpendicularly to the longitudinal direction thereof is excited.

Preferably, the piezoelectric member and a plurality of the internal electrodes disposed in the piezoelectric member are obtained by a ceramic integral firing technique. That is, preferably, a plurality of the internal electrodes and the piezoelectric member are integrally fired.

Preferably, the device further includes an inactive layer to which no electric field is applied at driving, arranged in at least one end in the longitudinal direction of the piezoelectric member.

Preferably, the device further includes a holding portion arranged in the vicinity of a node of the bending vibration of the piezoelectric member and fixed to the piezoelectric member.

Also, preferably, the holding portion is arranged in the vicinity of a node in the direction passing through the node of the piezoelectric member and being substantially perpendicular to the longitudinal direction of the piezoelectric member.

A piezoelectric device of various preferred embodiments of the present invention can be used as different types of piezoelectric resonator apparatuses. Preferably, there is provided a ladder type filter which includes a substrate, and a plurality of the piezoelectric devices according to various preferred embodiments of the present invention, the plurality of the piezoelectric devices being electrically connected so as to define a ladder type circuit configuration.

According to a fourth preferred embodiment of the present invention, a method of producing a piezoelectric device includes the steps of preparing a lamination type piezoelectric member which has a first end surface and a second end surface arranged on both ends in the longitudinal direction thereof, an upper surface and a lower surface each extending between the first end surface and the second end surface, and a first side surface and a second side surface, and include a plurality of first internal electrodes and a plurality of second internal electrodes extending substantially perpendicularly to the longitudinal direction and embedded therein, each first internal electrode including a first divided internal electrode and a second divided internal electrode, applying a DC voltage across the first and second divided internal electrode and the second internal electrode of the lamination type piezoelectric member, so that pairs of the piezoelectric layers which are adjacent in the longitudinal direction are polarized in the opposite polarization directions via the internal electrodes, and the inside of each piezoelectric layer is polarized in the same polarization direction, forming a first external electrode electrically connected to the first internal electrode and a second external electrode electrically connected to the second internal electrode on the outer surface of the piezoelectric member.

According to a fifth preferred embodiment of the present invention, a method of producing a piezoelectric device includes the steps of preparing a lamination type piezoelectric member which has a first end surface and a second end surface arranged on both ends in the longitudinal direction thereof, an upper surface and a lower surface each extending between the first end surface and the second end surface, and a first side surface and a second side surface, and include a plurality of first internal electrodes and a plurality of second internal electrodes which are alternately arranged so as to be overlapped with each other via the piezoelectric layers in the longitudinal direction, respectively, at least one of each first internal electrode and each second internal electrode having first and second divided internal electrodes divided substantially perpendicularly to the longitudinal direction of the piezoelectric member, polarizing the lamination type piezoelectric member in such a manner that a first piezoelectric region lying on the first side surface side or on the upper surface side, and a second piezoelectric region lying on the second side surface side or on the lower surface side have opposite polarization directions in the longitudinal direction of the piezoelectric member, and moreover, one of the piezoelectric regions which are adjacent in the longitudinal direction have the opposite polarization directions in the longitudinal direction; and forming a first external electrode electrically connected to the first internal electrode and a second external electrode electrically connected to the second internal electrode on the outer surface of the piezoelectric member.

Preferably, the method further includes the step of forming an external relay electrode for electrically connecting the first and second divided internal electrodes to each other onto the outer surface of the piezoelectric member.

Other features, elements, characteristics, steps and advantages of the present invention will become more apparent from the following detailed description of preferred embodiments thereof with reference to the attached drawings.

DETAILED DESCRIPTION OF PREFERRED EMBODIMENTS

Hereinafter, the present invention will be apparent from the description of preferred embodiments of the present invention with reference to the drawings.

Figure 1:
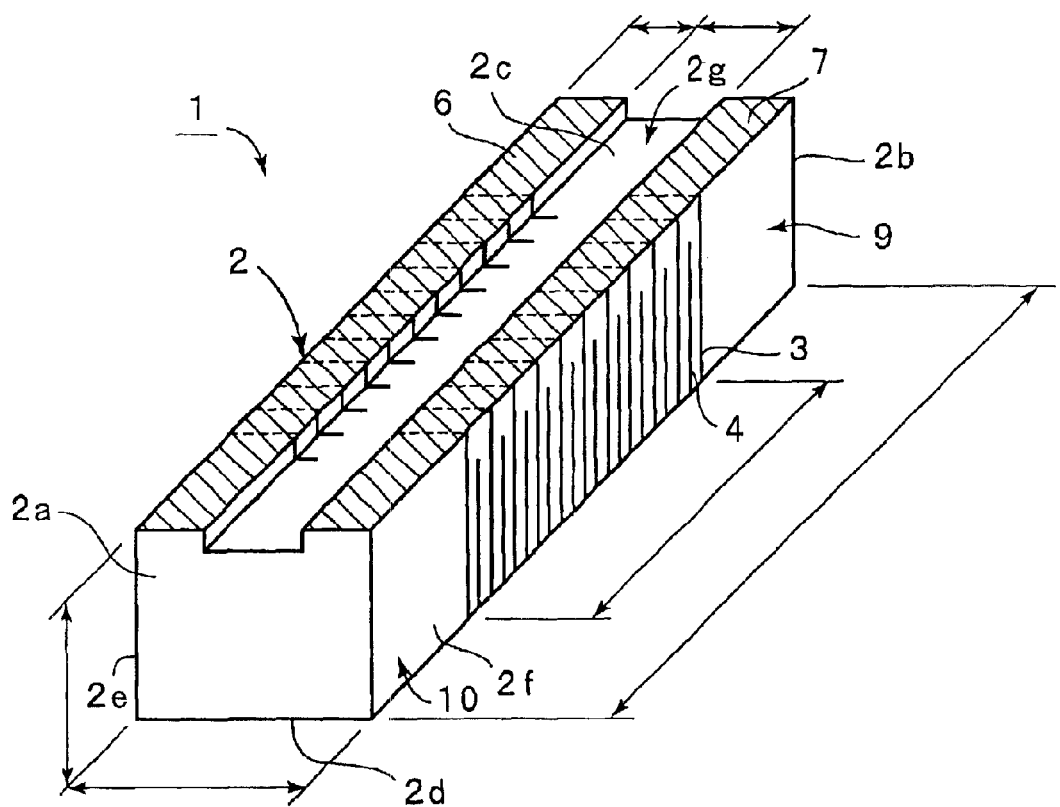
FIG. 1 is a perspective view of a piezoelectric device according to a first preferred embodiment of the present invention.

FIG. 1 is a perspective view of a piezoelectric device according to a first preferred embodiment of the present invention. A piezoelectric device 1 is preferably a bimorph type piezoelectric resonator which is operable to excite a bending vibration mode in which the device 1 is bent substantially perpendicularly to the longitudinal direction thereof utilizing a piezoelectric longitudinal effect.

The piezoelectric device 1 preferably includes a piezoelectric member 2. For the piezoelectric member 2, an appropriate piezoelectric ceramic such as a lead titanate zirconate type ceramic is preferably used. The piezoelectric member 2 is longer in one direction, that is, has substantially a parallelepiped-shape. Thus, first and second end surfaces 2a and 2b are arranged on both of the ends in the longitudinal direction of the piezoelectric member 2, extending substantially perpendicularly to the longitudinal direction of the piezoelectric member 2. Moreover, the piezoelectric member 2 has an upper surface 2c, a lower surface 2d, a first side surface 2e, and a second side surface 2f.

A groove 2g is formed on the upper surface 2c so as to elongate in the longitudinal direction of the piezoelectric member 2. The groove 2g is formed in the approximately central portion in the wide direction of the upper surface 2c so as to elongate in the longitudinal direction of the piezoelectric member 2.

A portion of the piezoelectric device 1 which lies under the groove 2g constitutes a central inactive region 2h as described later with reference to FIG. 3. First and second piezoelectric regions 2i and 2j are disposed on both sides of the central inactive region. The first piezoelectric region 2i is a portion of the piezoelectric device lying between the central inactive region 2h and the first side surface 2e. The second piezoelectric region 2j is a portion of the piezoelectric device 1 between the central inactive region 2h and the second side surface 2f.

The piezoelectric device 1 of this preferred embodiment is a bimorph type piezoelectric vibration device, in which 180° out-of-phase expanding/contracting drive forces are generated in the first and second piezoelectric regions 2i and 2j, and thereby, the bending vibration is excited, in which the entire portion in the longitudinal direction of the piezoelectric member 2 is bent substantially perpendicularly to the longitudinal direction thereof.

A plurality of first internal electrodes 3 and a plurality of second internal electrodes 4 are disposed in the piezoelectric member 2, extending substantially perpendicularly to the longitudinal direction of the member 2, as shown in FIG. 1.

Figure 2A:
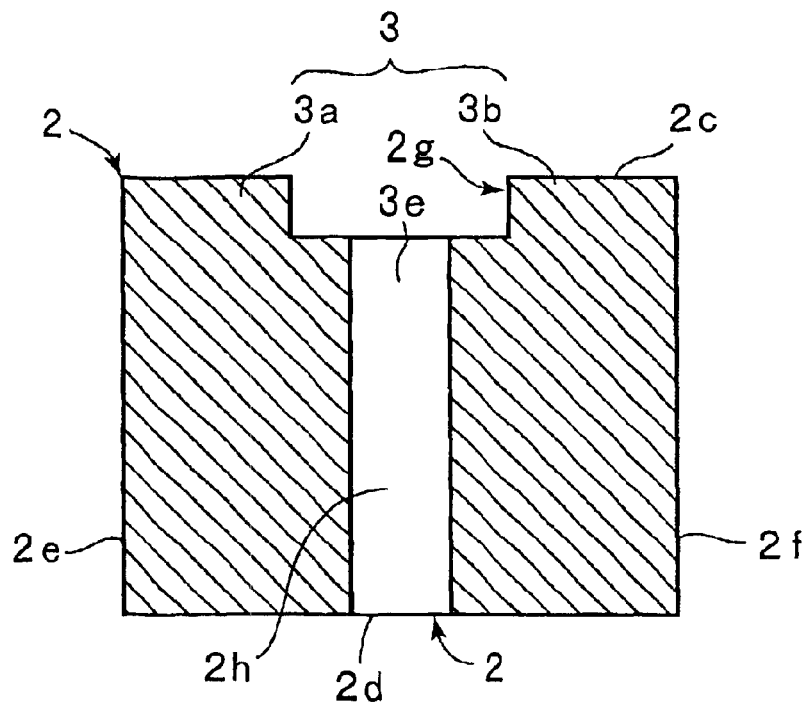
FIG. 2A is a transverse cross-sectional view of the portion of the piezoelectric device of the first preferred embodiment in which a first internal electrode is disposed.

The first and second internal electrodes 3 and 4 are alternately arranged in the longitudinal direction. Each of the first internal electrodes 3 includes a first divided internal electrode 3a and a second divided internal electrode 3b, as shown in FIG. 2A. That is, the first internal electrode 3 is divided into the first and second divided internal electrodes 3a and 3b with respect to the center in the width direction of a cross-section taken substantially perpendicularly to the longitudinal direction of the piezoelectric member 2. A gap is formed between the first and second divided internal electrodes 3a and 3b.

The first divided internal electrode 3a is arranged so as to extend to the upper surface 2c, the first side surface 2e, and the lower surface 2d of the piezoelectric member 2. The second divided internal electrode 3b is arranged so as to extend to the upper surface 2c, the second side surface 2f, and the lower surface 2d.

Figure 2B:
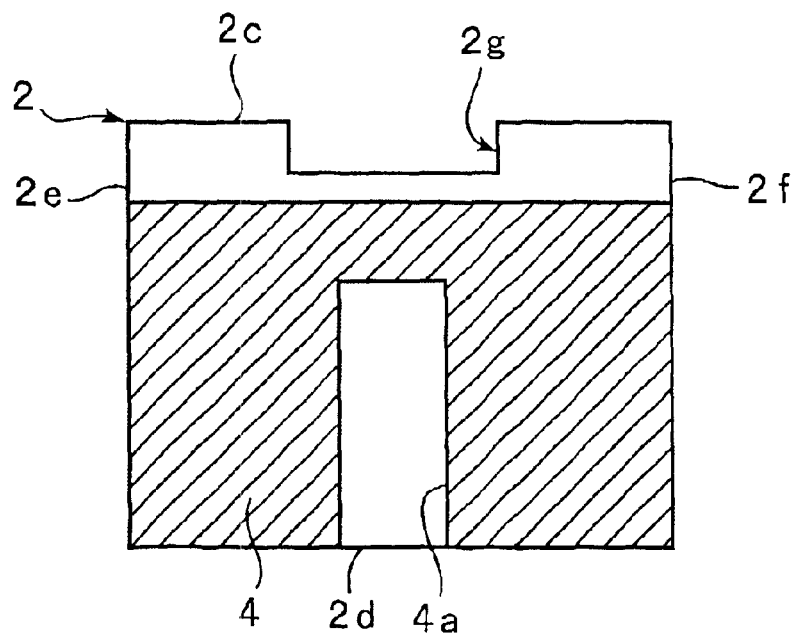
FIG. 2B is a transverse cross-sectional view of the portion of the piezoelectric device in which a second internal electrode is disposed.

On the other hand, each second internal electrode 4 is arranged so as to extend from the first side surface 2e to the second side surface 2f, as shown in FIG. 2B. The second internal electrode 4 has a notch 4a which is formed in the approximate center in the width direction of the member 2 and opens downward. Moreover, the second internal electrode 4 is arranged so as not to extend to the upper surface 2e. The second internal electrode 4 is arranged so as to extend to the first and second side surfaces 2e and 2f and the lower surface 2d.

The first internal electrodes 3 and the second internal electrodes 4 are overlapped with each other via piezoelectric layers in the longitudinal direction of the piezoelectric member 2, respectively.

In this preferred embodiment, the width of the gap 3c is preferably substantially equal to the width of the notch 4c. Therefore, the fist and second divided internal electrodes 3a and 3b are overlapped with the second internal electrode 4 via the piezoelectric layer. Furthermore, the portion of the piezoelectric member 2 in which the gaps 3d and the notches 4s are overlapped with each other constitutes the above-described central inactive region. It should be noted that the notch 4a is not necessarily formed.

The piezoelectric layers provided between the first and second internal electrodes 3 and 4 are polarized, respectively. Piezoelectric layers which are adjacent in the longitudinal direction of the piezoelectric member 2 are polarized in the opposite polarization directions, as shown in the schematic plan view of FIG. 3. For example, piezoelectric layers 2m and 2n are arranged on both sides of the second internal electrode 4 in the structure schematically shown in the plan view of FIG. 3. The piezoelectric layer 2m is polarized in a polarization direction P. The piezoelectric layer 2m is polarized in the polarization direction shown by −P.

Referring to the piezoelectric layer 2m as an example, both of the first piezoelectric region 2i and the second piezoelectric region in the piezoelectric layer 2m are polarized in the polarization direction shown by the arrow P, namely, in the same polarization direction in the piezoelectric layer 2m.

Pairs of adjacent piezoelectric layers in the longitudinal direction sandwiched between the first internal electrodes 3 and the second internal electrodes 4 are polarized in the opposite polarization directions.

For example, the following production methods are preferably used so that the above-described polarization structure is provided for the piezoelectric member 2. In particular, first, a ceramic green sheet as a mother including a piezoelectric ceramic such as lead titanate zirconate type ceramic is prepared. Next, a plurality of the first internal electrodes 3 are printed on the ceramic green sheet as a mother. A plurality of the second internal electrodes 4 are printed on another ceramic green sheet as a mother. Thus, the first and second ceramic green sheets as mothers are laminated. Moreover, an appropriate number of the non-printed ceramic green sheets as mothers are laminated on the outermost sides in the lamination direction.

The laminate as a mother obtained as described above is cut in the thickness direction in such a manner that the laminates corresponding to the individual piezoelectric devices can be obtained. Each of the obtained laminates is fired to produce an integrally-fired lamination-type piezoelectric member.

Thereafter, the portion of each internal electrode 3 exposed onto the lower surface of the lamination type piezoelectric member is coated with insulating paste or other suitable material. In this state, electrodes for polarization are disposed on the upper and lower surfaces of the piezoelectric member, respectively. The piezoelectric member layers sandwiched between the internal electrodes 3 and 4 are polarized by applying a DC voltage across the polarization electrodes disposed on the upper and lower surfaces. Thereafter, the above-described groove 2g is formed in the upper surface of the piezoelectric member 2. The polarization electrode is removed form the lower surface of the piezoelectric member 2. Thus, the piezoelectric device 1 is obtained. To interrupt the electrical connection between the polarization electrode disposed on the lower surface of the piezoelectric member 2 and the first internal electrode 3, the above-described insulating paste is not necessarily used. That is, the divided internal electrodes 3a and 3b are arranged in such a manner that gaps are formed between the lower surface 2d and the divided internal electrodes 3a and 3b whereby the lower end of the internal electrode 3 does not extend to the lower surface 2d.

By the formation of the groove 2g, the polarization electrode disposed on the upper surface is divided. Thus, the first and second external electrodes 6 and 7 are arranged as shown in FIG. 1.

Moreover, referring to the polarization, only the portions of the piezoelectric member 2 which are sandwiched between the internal electrodes 3 and 4, respectively, are polarized, and the portions of the piezoelectric member 2 which lie on the outer side in the longitudinal direction of the sandwiched portions thereof are not polarized.

No particular limitation is imposed on electrode materials for the internal electrodes 3 and 4 and the external electrodes 6 and 7. For example, the internal electrodes 3 and 4 can be formed by printing electroconductive paste such as Ag paste or other suitable material, and baking it while the firing is carried out. The external electrodes 6 and 7 can be formed by thin-film forming methods such as plating, sputtering, or other suitable method.

Figure 3:
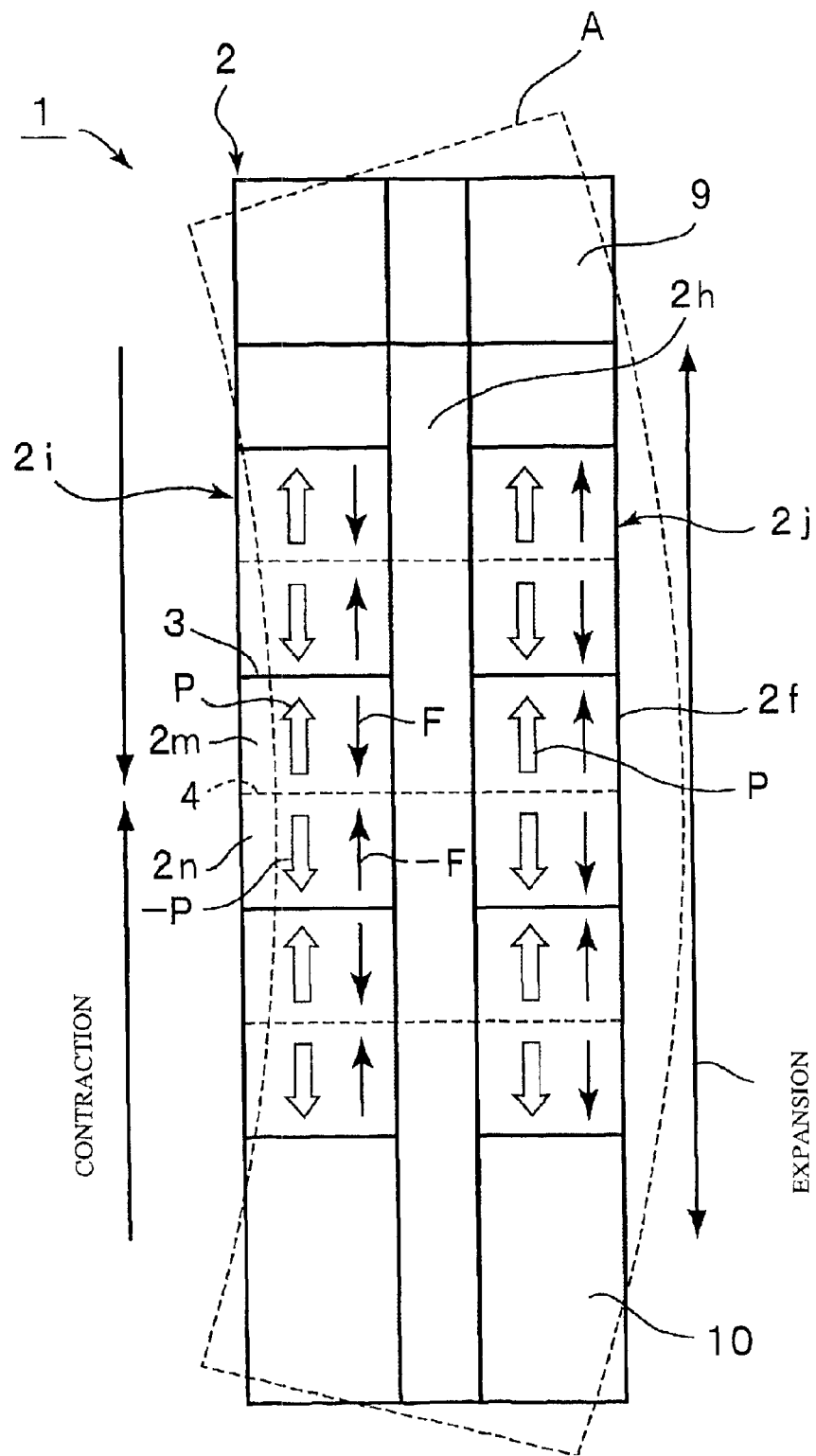
FIG. 3 is a schematic plan view illustrating the principle of the piezoelectric device of the first preferred embodiment of the present invention.

As shown in FIGS. 1 and 3, a plurality of the piezoelectric layers each sandwiched between the internal electrodes 3 and 4 are arranged in the longitudinal direction. The first and second inactive layers 9 and 10 are disposed on both of the ends in the longitudinal direction of the portion of the piezoelectric member in which the first and second internal electrodes 3 and 4 are overlapped with each other. The first and second inactive layers 9 and 10 are not sandwiched between the first and second internal electrodes 3 and 4 as seen in the above-described production method. Thus, the inactive layers 9 and 10 are not the portions of the piezoelectric member which are positively excited when the member is vibrated. Moreover, as described above, the center inactive region 2h in which the first and second internal electrodes 3 and 4 are not overlapped with each other is disposed in the approximately central portion in the width direction of the piezoelectric member 2.

Hereinafter, the operation of the piezoelectric device 1 will be described. For driving, an AC voltage is applied across the first and second external electrodes 6 and 7. As a result, electric fields having reversed polarities are applied to piezoelectric layers which are adjacent in the longitudinal direction, for example, to the piezoelectric layers 2m and 2n, as shown by arrows F and –F. The piezoelectric layers 2m and 2n are polarized in the opposite polarization directions in the longitudinal direction of the piezoelectric member 2. Thus, the respective piezoelectric layers in the piezoelectric region 2i expand and contract in the same direction with respect to the longitudinal direction of the piezoelectric member 2.

Referring to the second piezoelectric region 2j, as typically seen in the piezoelectric layers 2m and 2n, electric fields having reversed polarities are applied to piezoelectric layers 2m and 2n which are adjacent in the longitudinal direction of the piezoelectric member 2.

Accordingly, the first and second piezoelectric regions 2i and 2j are vibrated 180° out-of-phase with each other.

Thus, the first and second piezoelectric regions 2i and 2j expand and contract 180° out-of-phase with each other in the longitudinal direction. Therefore, the entire piezoelectric member 2 is vibrated, repeatedly taking the form shown by broken line A and then, its form is bent in the opposite direction from the posture shown by the broken line A. That is, the piezoelectric member 2 is vibrated in the bending vibration mode in which the member 2 is bent substantially perpendicularly relative to the longitudinal direction thereof.

In other words, the first and second piezoelectric regions 2i and 2j arranged on both sides in the width direction of the central inactive region 2h in the piezoelectric device 1 are vibrated 180° out of phase with each other. That is, a bimorph type piezoelectric vibration device is provided. As described above, the piezoelectric device 1 is operable to excite the bending vibration mode due to its piezoelectric longitudinal effect in which the device 1 is bent substantially perpendicularly relative to the longitudinal direction thereof.

The above-described central inactive region 2h is not indispensable. However, to produce the polarization structures in the first drive region 2i and the second drive region 2j, it is necessary to form the gaps in the first internal electrodes 3, as seen in the above-described production method. As a result, the central inactive region 2h is provided. It is desirable to provide the central inactive region 2h, since stresses generated in the opposite directions in the interfaces between the first and second piezoelectric regions 2i and 2j can be absorbed.

The dimension in the width direction of the central inactive region 2h may be appropriately selected, provided that the above-described stress-relaxation effect can be realized.

Moreover, the piezoelectric device 1 preferably includes the inactive layers 9 and 10 on both ends in the longitudinal direction thereof. The inactive layers 9 and 10 are not polarized, and no electric fields are applied thereto when the device 1 is used. Thus, the inactive layers 9 and 10 are piezoelectrically inactive.

The above-described inactive layers 9 and 10 are not indispensable. However, it is preferable to provide the inactive layers 9 and 10 on both ends of the device 1. For example, as schematically shown in FIG. 3, when the device 1 is operated, the first piezoelectric region 2i is contracted, while the second piezoelectric region 2j is expanded, and then, the region 2i is expanded, while the region 2j is contracted. This movement is repeated. In this case, when the above-described vibration forms are realized, the central portion in the longitudinal direction of the piezoelectric member 2 and the portions on both ends in the longitudinal direction thereof have different strains. That is, when the ends of the piezoelectric member 2 are not positively driven due to the piezoelectric longitudinal effect, the vibration form shown by the broken line A and the reverse form can be realized without any constraint. Thus, the provision of the inactive layers 9 and 10 is preferable.

The dimension in the longitudinal direction of the inactive layers 9 and 10 will be described later with reference to the experimental examples.

In the piezoelectric device 1 of this preferred embodiment, the bending vibration carried out substantially perpendicularly to the longitudinal direction of the device 1 is used. Thus, the piezoelectric device 1 can be reduced in size compared to a piezoelectric resonator using radial vibration or length-expanding/contracting vibration of the prior art. In the case of the radial vibration, the resonance frequency depends on the diameter of a piezoelectric plate, and for the length-expanding/contracting vibration, the resonance frequency depends on the length of a piezoelectric member. In the piezoelectric device 1 of this preferred embodiment, the resonance frequency is proportional to the ratio of the width of the piezoelectric member to the length thereof. Therefore, the dimensions in the width and longitudinal directions of the device 1 can be reduced with the ratio being maintained at a constant value. That is, in the case in which a piezoelectric resonator having a desired frequency is produced, the size of the piezoelectric resonator can be more reduced compared to that of a prior art piezoelectric resonator.

It has been confirmed in the experiment by the inventors of this patent application that, for example, to attain a resonance frequency of approximately 450 kHz with the piezoelectric device 1 of this preferred embodiment, the length of the piezoelectric member 2 needs to be about 1.8 mm, and the width thereof needs to be about 0.5 mm, while to attain a resonance frequency of about 450 kHz with a prior art piezoelectric resonator utilizing expanding/contracting vibration and made of the same material as the piezoelectric device 1 of this preferred embodiment, the length of the piezoelectric member 2 needs to be about 4.0 mm.

In this preferred embodiment, it can be seen that the piezoelectric resonator can be greatly reduced in size.

Moreover, the piezoelectric device 1 of this preferred embodiment, which utilizes the piezoelectric longitudinal effect, has a larger bandwidth than a prior art piezoelectric resonator utilizing a piezoelectric transverse effect. A bimorph type piezoelectric resonator utilizing the piezoelectric transverse effect can be also greatly reduced in size. In this preferred embodiment, the polarization structure is devised so that the piezoelectric longitudinal effect can be utilized. Accordingly, the size of the piezoelectric device 1 can not only be greatly reduced but the bandwidth can be easily increased.

The piezoelectric device 1 of this preferred embodiment has a lamination structure in which a plurality of the internal electrodes 3 and 4 and the piezoelectric layers are laminated on each other. The design flexibility for the electrostatic capacity is high.

In addition, the vibration in the bending mode in which the piezoelectric device 1 is bent substantially perpendicularly to the longitudinal direction can be smoothly excited, due to the presence of the inactive layers 9 and 10. Thus, the bandwidth can be further increased.

Also, in the piezoelectric device 1, the first and second external electrodes 6 and 7 are disposed on the upper surface 2c of the piezoelectric member 2. Accordingly, the piezoelectric device 1 can be conveniently mounted onto a circuit substrate or other suitable substrate by using the upper surface 2c of the piezoelectric member 2. That is, the piezoelectric device 1 can be easily mounted onto a circuit substrate, a case substrate, or other suitable substrate, e.g., by a face-down bonding system.

In addition, the piezoelectric device 1 is a bimorph type piezoelectric device utilizing the first and second piezoelectric regions 2i and 2j. Thus, the band-width of the piezoelectric device 1 can be increased compared to a unimorph type piezoelectric device.

Moreover, the second internal electrodes 4 are arranged so as not to extend to the upper surface 2c of the piezoelectric member 2. Therefore, it is unnecessary to insulation-process the outer surface of the piezoelectric member 2 for insulation of the internal electrodes 4 from the external electrodes 6 and 7 which must not contact with the internal electrodes 4.

In the piezoelectric device 1 of this preferred embodiment, the first divided internal electrode 3a and the second divided internal electrode 3b constituting the first internal electrode 3 are divided with respect to the center in the width direction of the piezoelectric member 2, and are arranged so as to extend to the upper surface 2c, the lower surface 2d, and the first and second side surfaces 2e and 2f, respectively. As seen in a modification shown in FIG. 4A, the first internal electrode 13 may be arranged so as to be divided into two upper and lower portions, that is, first and second divided internal electrodes 13a and 13b. In this case, the first divided internal electrode 13a is arranged so as to extend to the second side surface 2f, while the second divided internal electrode 13b is arranged so as to extend to the second side surface 2e. The first and second external electrodes 6 and 7 are disposed on the side surfaces 2f and 2e, respectively. In this case, as shown in FIG. 4B, a second internal electrode 14 is arranged as a common internal electrode so as not to extend to the side surfaces 2e and 2f of the piezoelectric member 2. The second internal electrode 14 is arranged so as to extend to the upper surface 2c and the lower surface 2d. For polarization, DC electric fields may be applied across the external electrodes 6 and 7 disposed on the first and second side surfaces and the internal electrode 14.

Figure 4A:
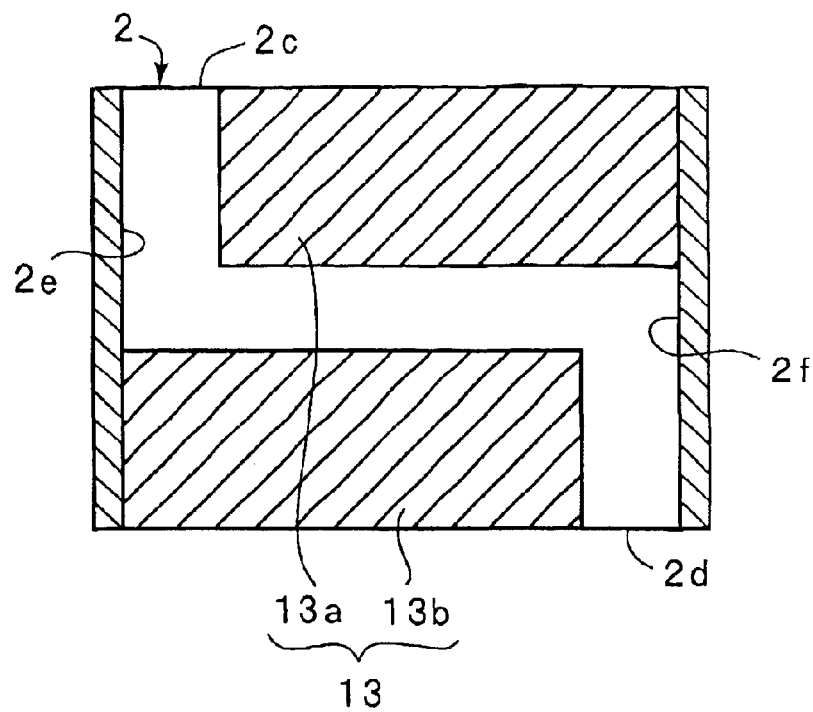
FIG. 4A is a transverse cross-sectional view of the portion of a modification of the first preferred embodiment in which a first internal electrode is disposed.
Figure 4B:
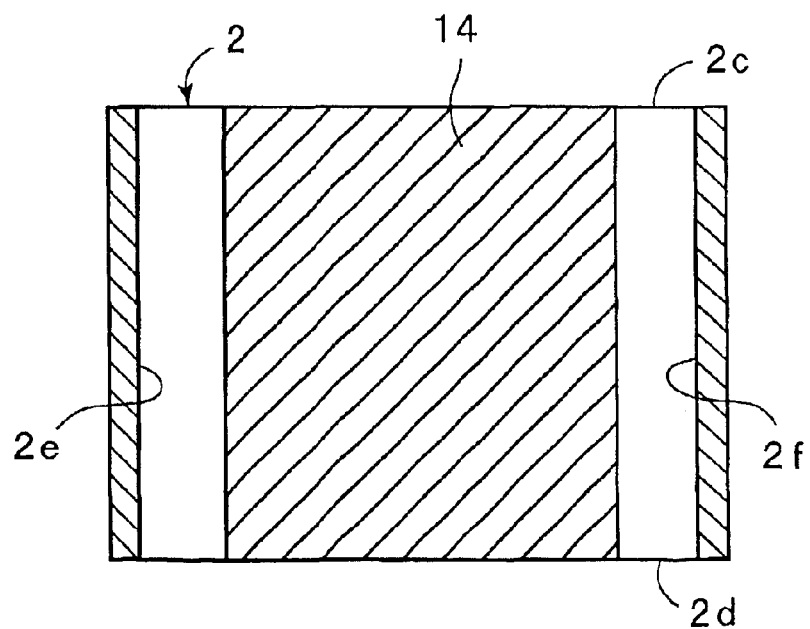
FIG. 4B is a transverse cross-sectional view of the portion of the modification in which a second internal electrode is disposed.

Accordingly, when the electrode structure shown in FIGS. 4A and 4B is used, the first and second piezoelectric regions are disposed in the upper and lower portions of the piezoelectric member 2, and an intermediate inactive region is arranged in the middle position in the height direction of the piezoelectric member 2.

Figure 5A:
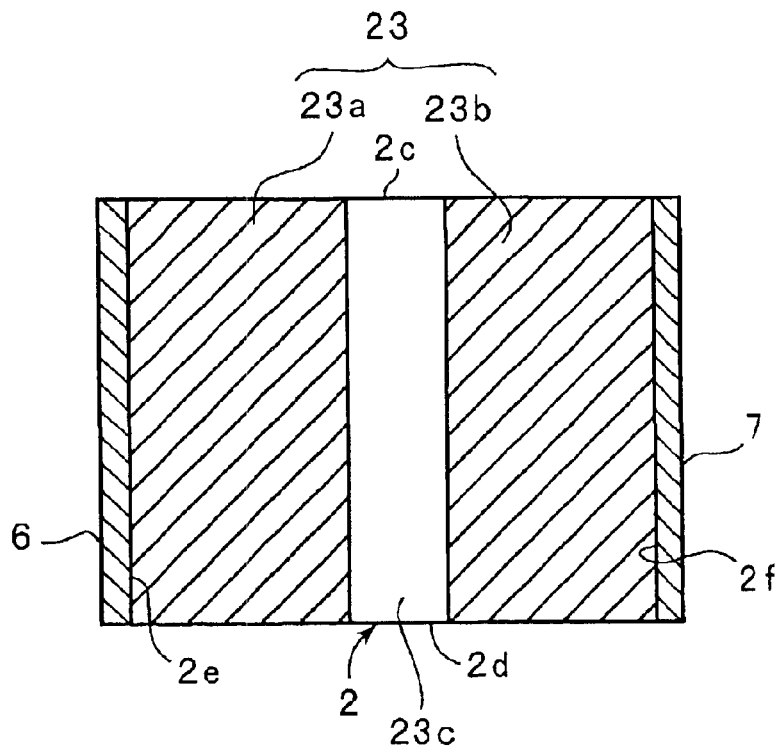
FIG. 5A is a transverse cross-sectional view of the portion of another modification of the first preferred embodiment in which a first internal electrode is disposed.
Figure 5B:
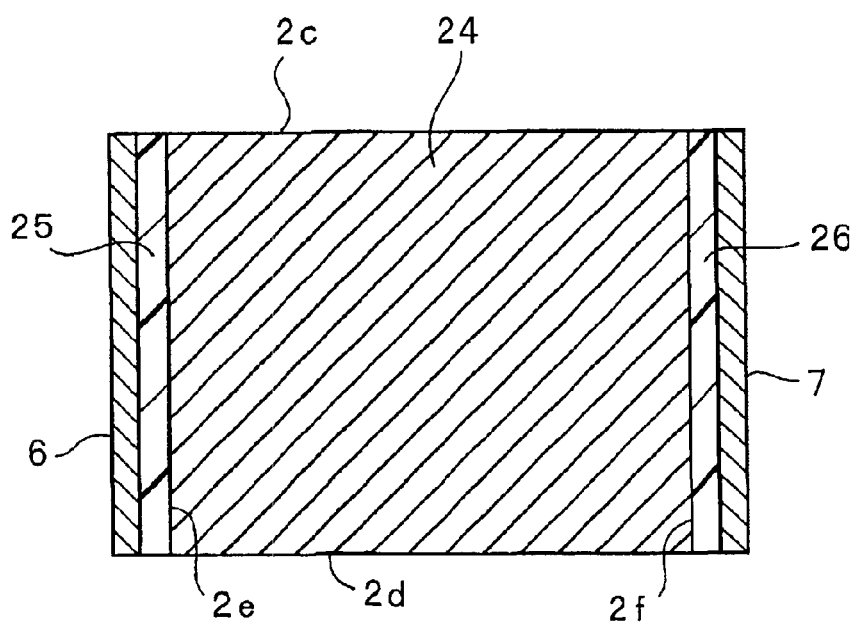
FIG. 5B is a transverse cross-sectional view of the portion of the modification in which a second internal electrode is disposed.

FIGS. 5A and 5B are cross-sectional views of another modification of the piezoelectric device of the first preferred embodiment, respectively. In this case, a first internal electrode 23 includes first and second divided internal electrodes 23a and 23b. The first and second divided internal electrodes 23a and 23b are arranged so as to extend to the upper surface 2c, the lower surface 2d, and the first and second side surfaces 2e and 2f, respectively. A gap 23c is formed between the first and second divided internal electrodes 23a and 23b.

On the other hand, a second electrode 24 is arranged define a common internal electrode extending to the upper and lower surfaces of the piezoelectric member 2, but so as not to extend to the first and second side surfaces 2e and 2f as shown in FIG. 5B. The first and second external electrodes 6 and 7 are disposed on the side surfaces 2e and 2f of the piezoelectric member 2, respectively.

To electrically insulate the first and second external electrodes 6 and 7 from the second internal electrode 24, insulation layers 25 and 26 are disposed on the side surfaces 2e and 2f. The insulation layers 25 and 26 have a belt shape vertically extending on the side surfaces 2e and 2f of the piezoelectric member 2.

Referring to the divided configurations of the first and second divided internal electrodes of the first internal electrode, the first and second divided internal electrodes may be separated with respect to the vertical or width direction of the piezoelectric member 2, as shown in FIGS. 4 and 5.

Figure 6:
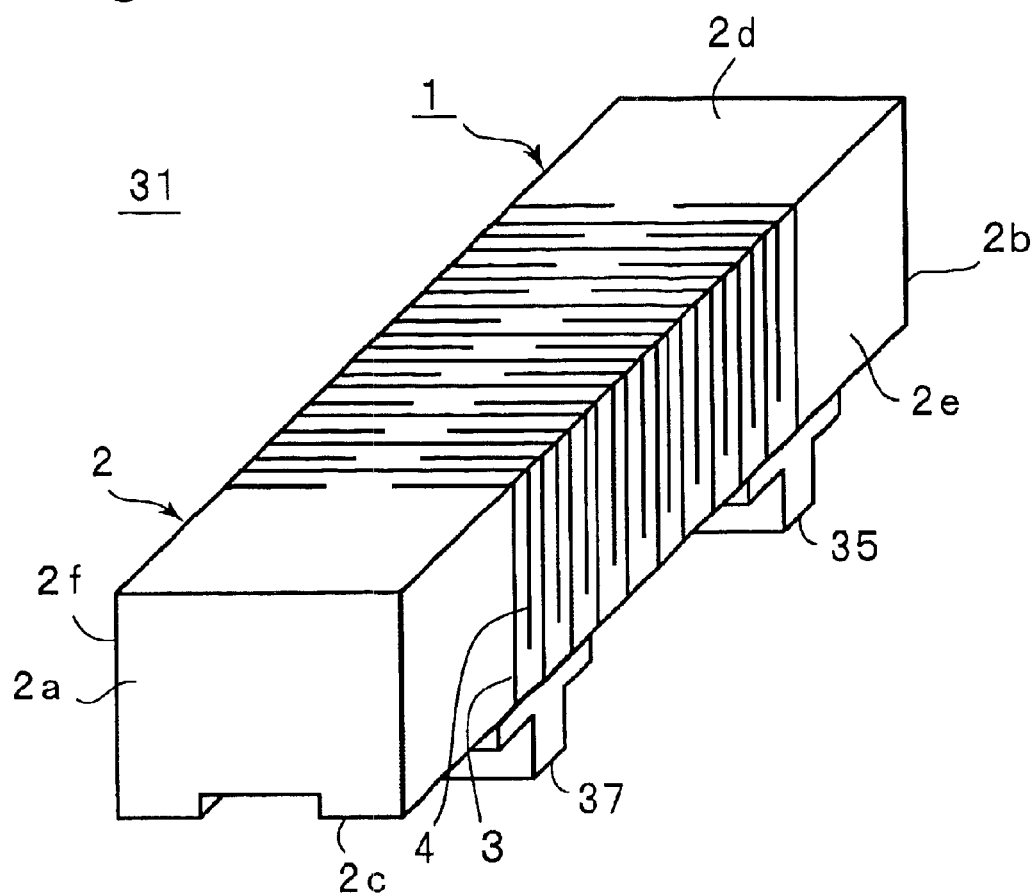
FIG. 6 is an exploded perspective view of the piezoelectric device of the first preferred embodiment showing the structure thereof for mounting onto a substrate.
Figure 6:
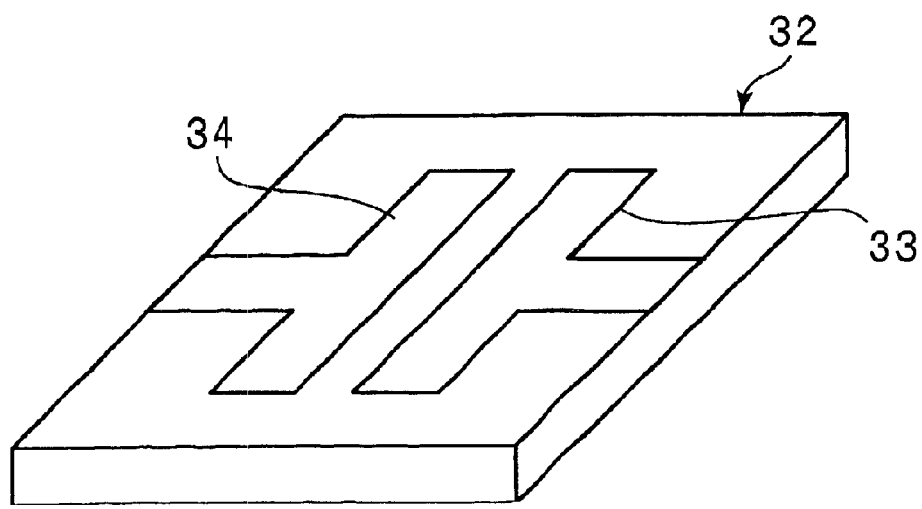

Hereafter, a piezoelectric resonator apparatus using the above-described piezoelectric device 1 will be described with reference to FIG. 6. In a piezoelectric resonator apparatus 31 shown in FIG. 6, the piezoelectric device 1 of the first preferred embodiment is inverted and fixed to a case substrate 32. Connecting electrodes 33 and 34 to be electrically connected to the first and second external electrodes 6 and 7 (see FIG. 1) are arranged at a predetermined interval on the case substrate 32.

Figure 7A:
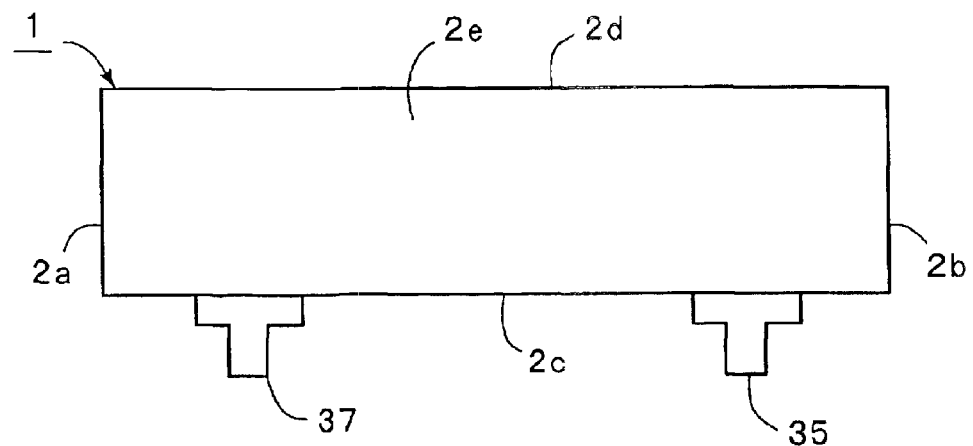
FIG. 7A is a side view of the piezoelectric device provided with holding portions shown in FIG. 6.
Figure 7B:
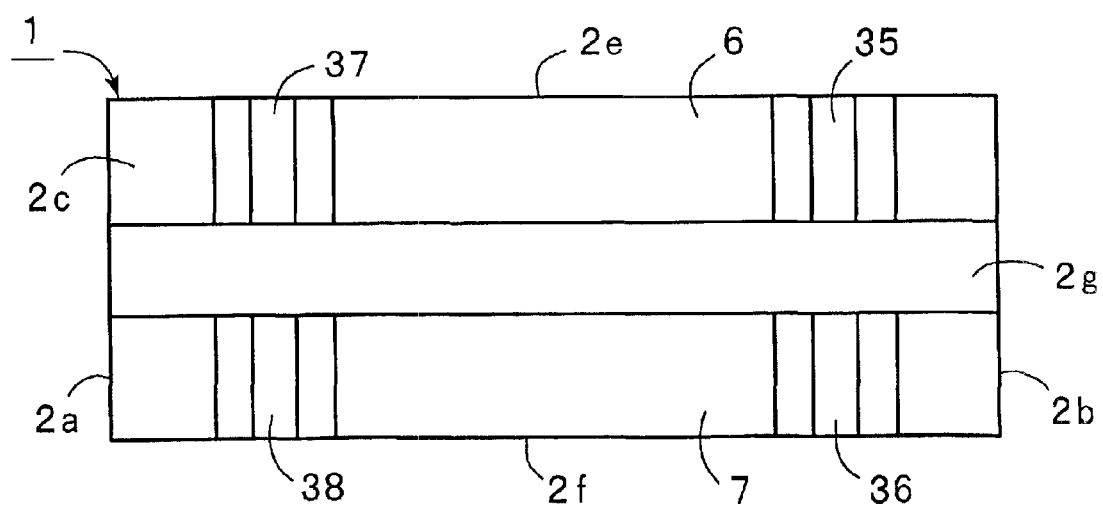
FIG. 7B is a bottom view of the piezoelectric device shown in FIG. 6.

On the other hand, holding portions 35 to 38 shown in FIGS. 7A and 7B are disposed on the upper surface 2c of the piezoelectric vibrator 2. The holding portions 35 to 38 having substantially T-shaped cross-sections are arranged substantially parallel to each other in the longitudinal direction of the piezoelectric vibrator 2, respectively, and are preferably made of an electroconductive resin including an Ag filler. The holding portions 35 and 37 are connected and bonded to the first external electrode 6, while the holding portions 36 and 38 are connected and bonded to the second external electrode 7.

For mounting, the holding portions 35 and 37 are bonded to the connecting electrode 33 via an electroconductive bonding material such as solder or other suitable material, while the holding portions 36 and 38 are bonded to the connecting electrode 34 via an electroconductive bonding material such as solder or other suitable material.

That is, the piezoelectric device 1 can be easily mounted onto the substrate 32 by face-down bonding.

The holding portions 35 to 38 function as bonding members for face-down bonding the piezoelectric device 1. That is, the holding portions 35 to 38 achieve both functions, that is, the electrical connection and mechanical fixing of the piezoelectric device 1 to the case substrate 32.

It is necessary to fix the holding portions 35 to 38 in such a manner so as not to disturb the vibration of the piezoelectric device 1 when the piezoelectric device 1 is driven. Accordingly, in this preferred embodiment, the holding portions 35 to 38 are arranged substantially in the nodes of the vibration generated when the bending vibration is excited in which the piezoelectric member 2 is bent substantially perpendicularly to the longitudinal direction thereof.

The vibration nodes of the bending vibration in which the piezoelectric member 2 is bent substantially perpendicularly to the longitudinal direction thereof exist at the two positions of the piezoelectric member 2 which lie at a predetermined interval in the longitudinal direction in planes passing through the center in the wide direction of the piezoelectric member 2 and being substantially parallel to the longitudinal direction thereof. The interval of the two nodes, that is, the first and second nodes is preferably about 0.54L, in which L is the size in the longitudinal direction of the piezoelectric member 2.

Accordingly, in this preferred embodiment, the holding portions 35 and 36 are arranged nearly at one of the nodes, and the holding portions 37 and 38 are arranged nearly at the other node. However, the holding portions 35 to 38, which perform the electrical connection function, are arranged not at the nodes, but in the same positions as the nodes in the longitudinal direction of the piezoelectric member 2 and slightly shifted from the nodes towards the outside in the width direction of the piezoelectric member 2. That is, the holding portions 35 and 36 are arranged on both sides in the width direction of the first node. The holding portions 36 and 38 are arranged on both sides in the width direction of the second node.

Even when the holding portions 35 to 38 are arranged not exactly at the nodes but in the positions slightly shifted from the nodes in the width direction, as described above, the piezoelectric device 1 can be held on the substrate 32, without significantly disturbing the length-bending mode as seen in this preferred embodiment.

Moreover, holding members only for mechanically holding the piezoelectric device 1 on the case substrate 32 may be used instead of the holding portions 35 to 38. In this case, the holding members may be fixed at the vibration nodes, and thereby, disturbance of the length bending vibration, caused by the mechanical support, can be further reduced. However, in this case, to electrically connect the first and second external electrodes 6 and 7 to the connecting electrodes 33 and 34 on the substrate 32, other electrical connecting members are needed.

As described above, the central inactive region 2h is disposed in the piezoelectric device 1 of this preferred embodiment. The bandwidth can be adjusted by controlling the size in the width direction of the central inactive region 2h. This will be described with reference to an experimental example.

Figure 8:
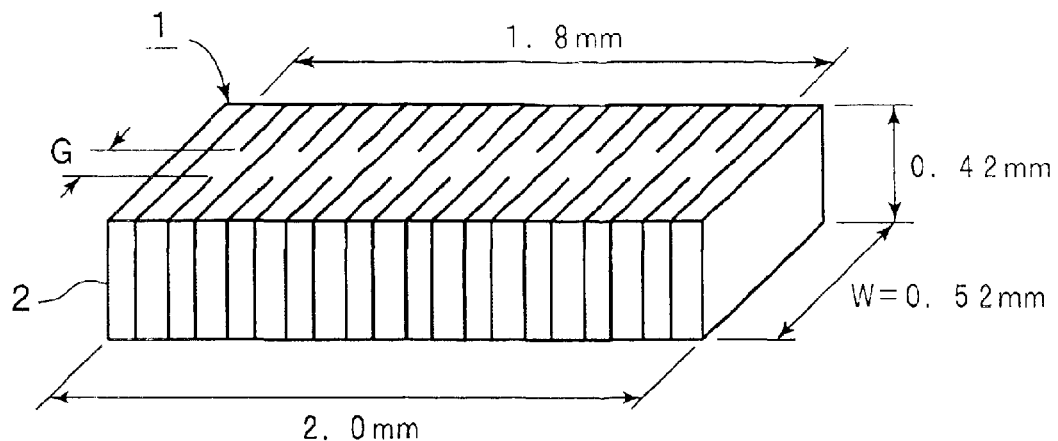
FIG. 8 is a schematic view illustrating the outside dimensions of the piezoelectric device of the first preferred embodiment and a gap G between the first and second piezoelectric regions thereof.

FIG. 8 is a schematic perspective view of the piezoelectric device 1. In this case, for easy understanding, the external electrodes are omitted, and the inactive layers on both ends of the piezoelectric member 2 are schematically shown.

Figure 9:
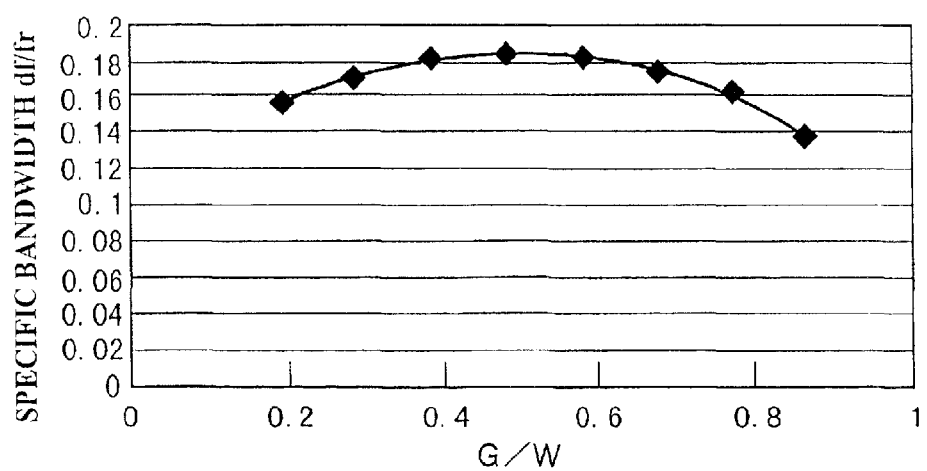
FIG. 9 is a graph showing a relationship between the ratio G/W in which G is a gap in the piezoelectric device of FIG. 8, and W is a width of the piezoelectric device, and a specific band-width df/dr.

The piezoelectric member 2 having a length of about 2.0 mm, a width of about 0.52 mm, and a thickness of about 0.42 mm, for example, made of lead titanate zirconate was prepared. In the piezoelectric member 2, eighteen piezoelectric layers each having a thickness of about 0.1 mm and sandwiched between first and second internal electrodes were formed. The piezoelectric device 1 of the first preferred embodiment was formed using the above-described piezoelectric member 2. Different types of piezoelectric members 2 with the width of the central inactive region 2h being changed in the range of about 2 mm to about 0.9 mm were prepared, and the bandwidths were measured. FIG. 9 shows the results. In FIG. 9, the ratio G/W of the width G of the central inactive region 2h to the size W in the width direction of the piezoelectric member 2 is plotted as abscissa. The specific bandwidth df/fr is plotted as ordinate, in which df represents the difference between the resonance frequency and the anti-resonance frequency, and fr represents the resonance frequency. As shown in FIG. 9, the specific bandwidth can be effectively increased by setting the ratio G/W of the width G of the central inactive region 2h to the size W in the width direction of the piezoelectric member 2 to be in the range of about 0.38 to about 0.57. Accordingly, the width of the central inactive region 2h is preferably set to be in the above-described particular range.

As described above, the bandwidth can be increased by providing the inactive layers 9 and 10 on both ends of the piezoelectric member 2. This will be described with reference to an experimental example.

Figure 10:
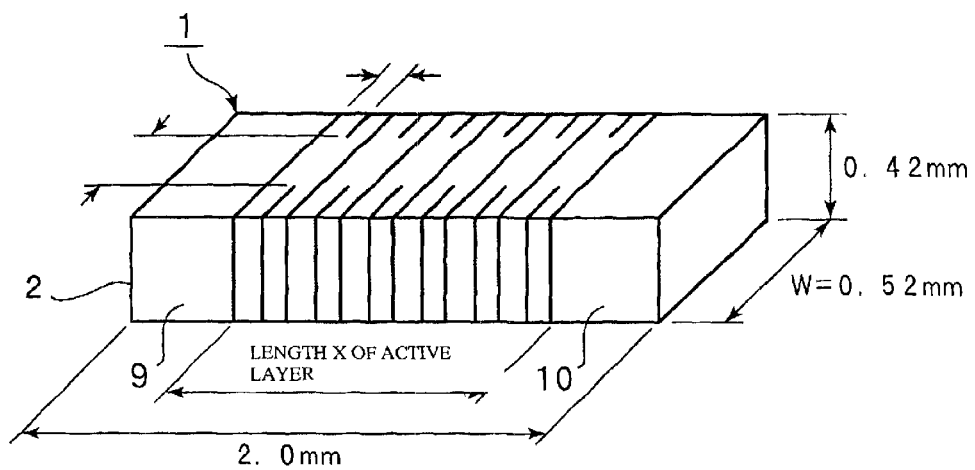
FIG. 10 is a schematic perspective view illustrating a relationship between inactive layers provided on both ends of the piezoelectric device of FIG. 1 and the size of the piezoelectric device.
Figure 11:
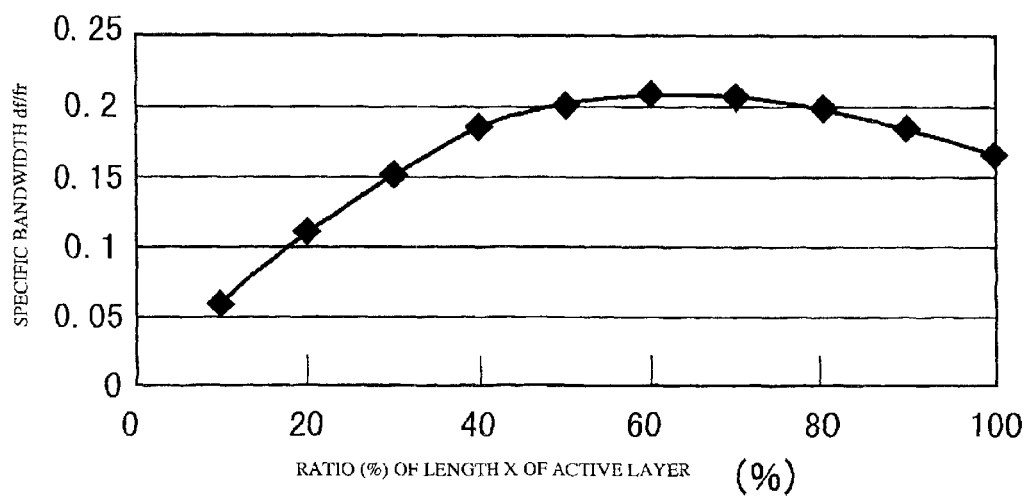
FIG. 11 is a graph showing a relationship between the ratio of the active layer, that is, the drive region excluding the inactive layers on both ends of the piezoelectric member of the piezoelectric device of FIG. 10.

Similarly to the above-described experiment, a piezoelectric member 2 having a length of about 2.0 mm, a width of about 0.52 mm, and a thickness of about 0.42, for example, was prepared as schematically shown in FIG. 10. A plurality of piezoelectric layers each having a thickness of about 0.1 mm were provided in the piezoelectric member 2. The number of the piezoelectric layers was changed in the range of from 2 to 20. As a result, the sizes in the longitudinal direction of the inactive layers 9 and 10 were changed. In this way, different types of piezoelectric devices 1 were formed. Investigation was made on the relationship between the ratio of the size in the longitudinal direction of the active layer and the specific bandwidth df/fr. FIG. 11 shows the results.

The ratio (%) of the size X in the longitudinal direction of the active layer is plotted as abscissa in FIG. 11. The ratio is defined as a ratio of the size in the longitudinal direction of the portion of the piezoelectric member 2 in which a plurality of the piezoelectric layers are provided, based on the size in the longitudinal direction of the piezoelectric device 1, that is, about 2.0 mm. Therefore, increase of the ratio means that the size in the longitudinal direction of the inactive layers 9 and 10 becomes shorter.

As seen in FIG. 11, the specific bandwidth becomes larger, that is, becomes about 0.2 or higher in the range of the ratio X of from about 50% to about 80%. In other words, it can be understood that the ratio of the size in the longitudinal direction of the inactive layers 9 and 10 is desirably set to be in the range of approximately (100–50)/2 to approximately (100–80)/2(%). Accordingly, the bandwidth can be effectively increased by setting the sizes in the longitudinal direction of the inactive layers 9 and 10 to be in the range of about 0.1L to about 0.25L, respectively.

Figure 12:
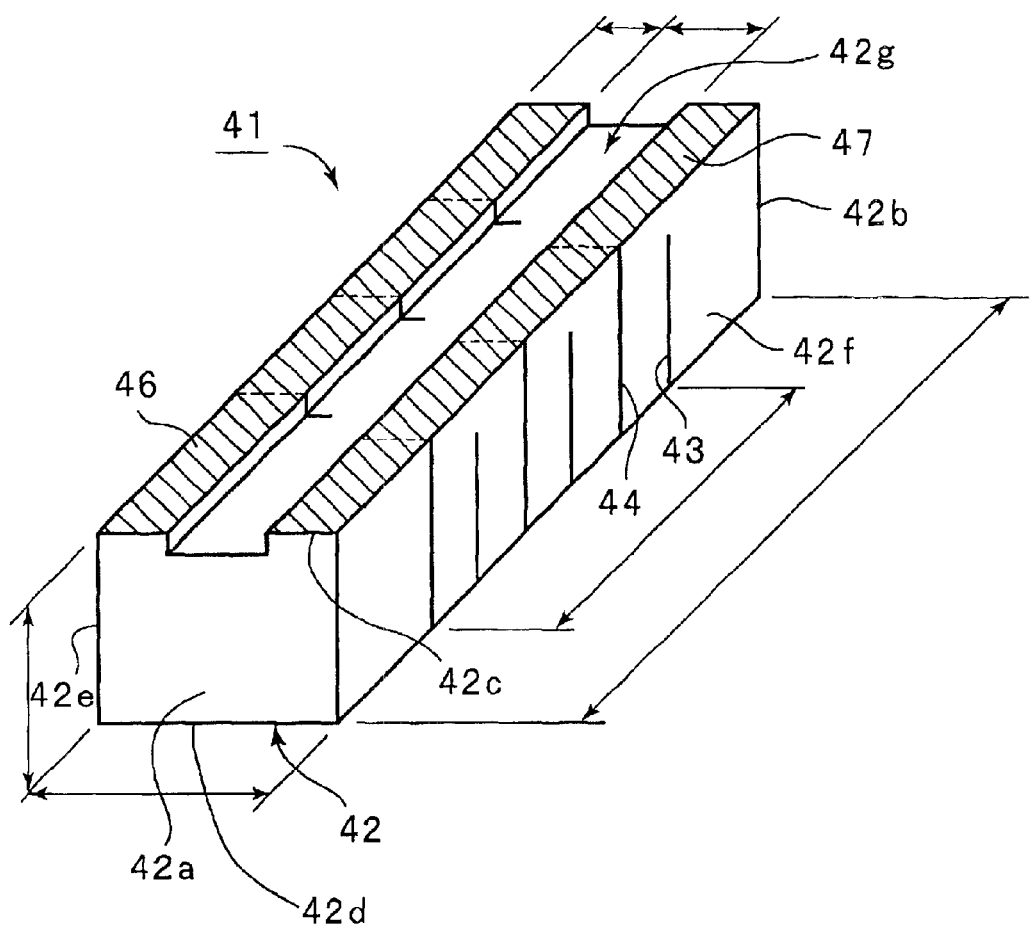
FIG. 12 is a perspective view showing the appearance of a piezoelectric device according to a second preferred embodiment of the present invention.

FIG. 12 is a perspective view of a piezoelectric device according to a second preferred embodiment of the present invention.

A piezoelectric device 41 includes a piezoelectric member 42 having substantially a parallelepiped shape as in the first preferred embodiment. The piezoelectric member 42 has first and second end surfaces 42a and 42b arranged on both ends in the longitudinal direction thereof, an upper surface 42c and a lower surface 42d with respect to the first and second end surfaces, and first and second end surfaces 42e and 42f. In this preferred embodiment, a groove 42g is formed in the approximate center in the width direction of the upper surface 42c, extending in the longitudinal direction of the piezoelectric member 42.

The piezoelectric member 42 is made of an appropriate piezoelectric ceramic such as a lead titanate zirconate type ceramic or other suitable material.

First and second internal electrodes 43 and 44 are arranged so as to extend substantially perpendicular to the longitudinal direction and overlap each other via the respective piezoelectric layers in the longitudinal direction. The first and second internal electrodes 43 and 44 are alternately arranged in the longitudinal direction of the piezoelectric member 42.

Figure 13A:
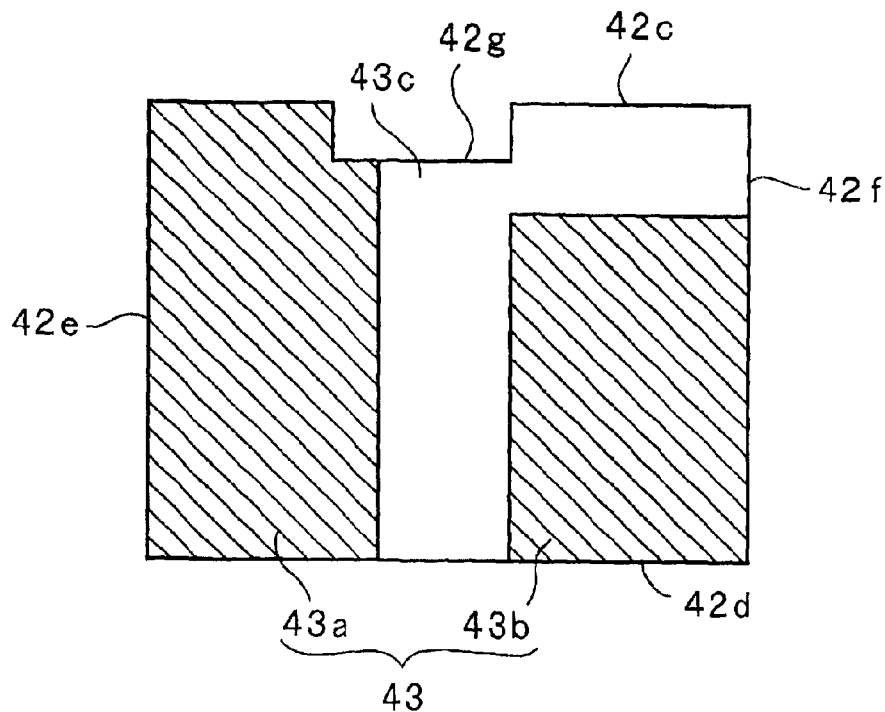
FIG. 13A is a transverse cross-sectional view of the portion of the piezoelectric member of the second preferred embodiment in which a first internal electrode is disposed.

FIG. 13A is a cross-sectional view of the portion of the piezoelectric member 42 in which a first internal electrode 43 is disposed. The first internal electrode 43 includes a first divided internal electrode 43a and a second divided internal electrode 43b. The first and second divided internal electrodes 43a and 43b are separated from each other via a gap 43c in the width direction of the piezoelectric member 42.

Figure 13B:
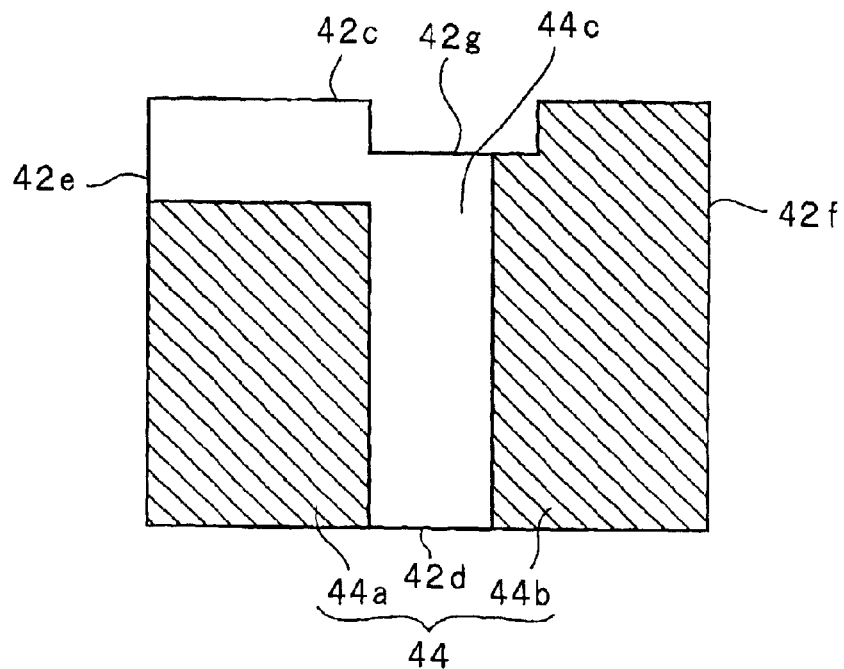
FIG. 13B is a transverse cross-sectional view of the portion of the piezoelectric member of the second preferred embodiment in which a second internal electrode is disposed.

FIG. 13B is a cross-sectional view of the portion of the piezoelectric member 42 in which a second internal electrode 44 is disposed. The second internal electrode 44 includes first and second divided internal electrodes 44a and 44b similarly to the first internal electrode 43. The first and second divided internal electrodes 44a and 44b are arranged so as to be separated from each other via a gap 44c.

The first divided internal electrode 43a of the first internal electrode 43 and the first divided internal electrode 44a of the second internal electrode 44 are overlapped with each other via the piezoelectric layer. Similarly, the divided internal electrode 43b and the divided internal electrode 44b are overlapped with each other via the piezoelectric layer.

The first divided internal electrode 43a of the first internal electrode 43 is arranged so as to extend to the upper surface of the piezoelectric member 42. The second divided internal electrode 43b is arranged so as not to extend the upper surface.

On the other hand, in the second internal electrode 44, the second divided internal electrode 44b is arranged so as to extend to the upper surface of the piezoelectric member 42. The first divided internal electrode 44a is arranged so as not to extend the upper surface 42c.

Accordingly, as seen in FIG. 12, the fist divided internal electrode 43a of the first internal electrode 43 is exposed onto the upper surface 42c on the first side surface 42e side of the groove 42g. Moreover, the second divided internal electrode 44b of the second internal electrode 44 is exposed onto the upper surface 42c of the piezoelectric member 42 on the second side surface 42f side of the groove 42g.

A first external electrode 46 is disposed on the upper surface 42c of the piezoelectric member 42 on the first-side surface 42e side of the groove 42g. A second external electrode 47 is disposed on the second side surface 42f side thereof.

Figure 14:
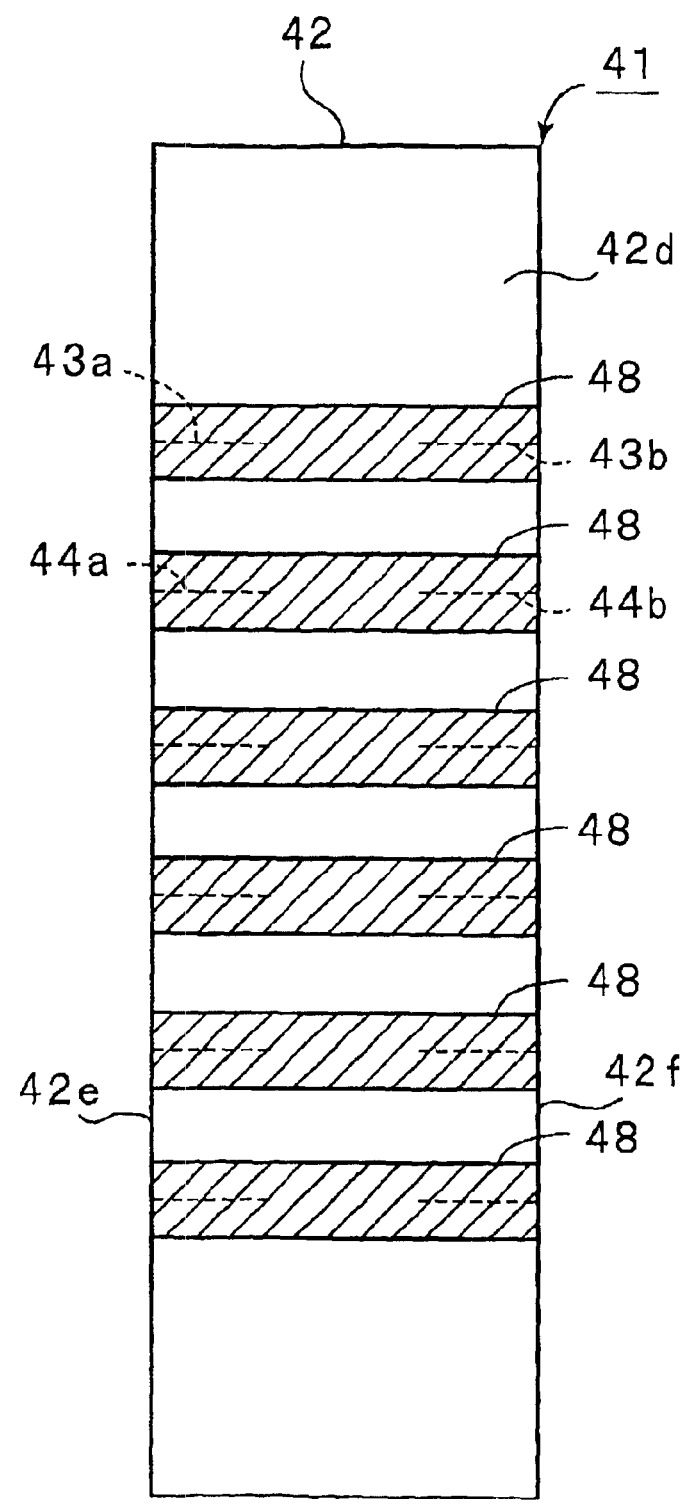
FIG. 14 is a bottom view of a piezoelectric device of the second preferred embodiment of the present invention.

A plurality of relay electrodes 48 are disposed on the lower surface of the piezoelectric member 42 as shown in FIG. 14. The relay electrodes 48 are arranged to electrically connect the first and second divided internal electrodes 43a and 43b of the first internal electrode 43 to each other and also connect the first and second divided internal electrodes 44a and 44b of the second internal electrode 44 to each other.

Accordingly, the first external electrode 46 is electrically connected to the first divided internal electrode 43a of the first internal electrode 43, and also is electrically connected to the second divided internal electrode 43b via the relay electrode 48.

Similarly, the second external electrode 47 is electrically connected to the upper end of the second internal electrode 44b of the second internal electrode 44, and also, electrically connected to the first divided internal electrode 44a via the relay electrode 48.

Figure 15:
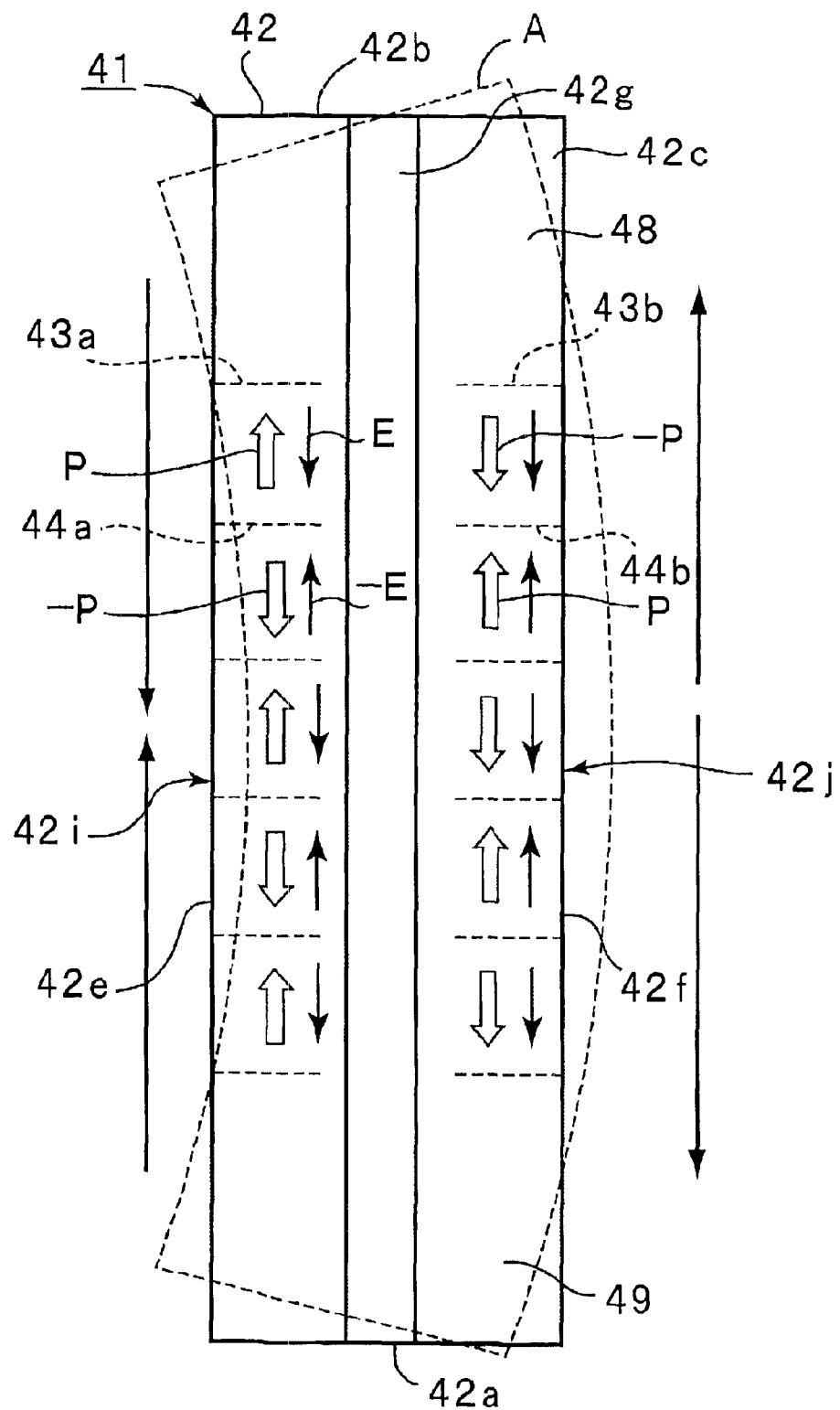
FIG. 15 is a schematic plan view illustrating the principle of the piezoelectric device of the second preferred embodiment of the present invention.

As schematically shown in the plan view of FIG. 15, the piezoelectric layers sandwiched between the first and second internal electrodes 43 and 44, respectively, are polarized in the longitudinal direction of the piezoelectric member 42. As shown in arrows P and -P in FIG. 15, in the piezoelectric layer sandwiched between a first internal electrode 43 and a second internal electrode 44, the first piezoelectric region 42i on the first side surface 42e side and the second piezoelectric region 42j on the second side surface 42f side are polarized in the opposite polarization directions. In other words, the piezoelectric region sandwiched between the first divided internal electrodes 43a and 44a, and the piezoelectric region sandwiched between the second divided internal electrodes 43b and 44b are polarized in the opposite polarization directions in the longitudinal direction of the piezoelectric member 42.

Moreover, the corresponding piezoelectric regions of piezoelectric layers which are adjacent in the longitudinal direction of the piezoelectric member 42 are polarized in the opposite polarization directions in the longitudinal direction of the piezoelectric member 42. That is, the first piezoelectric regions on both sides in the longitudinal direction of a divided internal electrode 43a are polarized in the opposite polarization direction in the longitudinal direction of the piezoelectric member 42. Similarly, the second piezoelectric regions on both sides in the longitudinal direction of a divided internal electrode 43b are also polarized in the opposite polarization directions in the longitudinal direction of the piezoelectric member 42.

The above-described polarization structure of the piezoelectric member 42 can be obtained by the following polarization process.

That is, first, the substantially rectangular parallelepiped piezoelectric member having the above-described first and second internal electrodes 43 and 44 disposed therein is prepared. Thereafter, a first polarization electrode is disposed on the entire upper surface of the piezoelectric member 42. The first polarization electrode is electrically connected to the first divided internal electrodes 43a and the second divided internal electrodes 44b of the first and second internal electrodes 43 and 44, respectively.

On the other hand, a second polarization electrode is arranged so as to be connected to the second divided internal electrodes 43b of the first internal electrodes 43 and the first divided internal electrodes 44a of the second internal electrodes 44, respectively.

An electric field is applied between the first and second polarization electrodes, and thereby, the above-described polarization structure is obtained.

Thereafter, the second polarization electrode is removed, and the above-described relay electrodes 48 are disposed on the lower surface of the piezoelectric member 42. Moreover, the groove 42g is formed in upper surface of the piezoelectric member 42 so as to divide the center of the first polarization electrode.

In this manner, the piezoelectric device 41 can be obtained.

For driving of the piezoelectric device 41, an AC voltage is applied across the first and second external electrodes 46 and 47. In this case, electric fields are applied to the piezoelectric regions of the respective piezoelectric layers as shown by arrows E and -E in FIG. 15. That is, in the piezoelectric layer sandwiched between a first internal electrode 43 and a second internal electrode 44, electric fields with the same polarities in the longitudinal direction of the piezoelectric member 42 are applied to both of the first and second piezoelectric regions. However, electric fields with reverse polarities in the longitudinal direction are applied to piezoelectric layers which are adjacent to each other in the longitudinal direction.

Accordingly, the piezoelectric device 41 constitutes a bimorph type vibration device. The device 41 is vibrated, taking the vibration form shown by broken line A in FIG. 15 and then the inverted vibration posture. That is, the length bending vibration is excited utilizing the piezoelectric longitudinal effect.

The piezoelectric device of the second preferred embodiment utilizes lengthwise bending vibration. Thus, when a piezoelectric resonator is produced, the size of the resonator can be more reduced compared to a piezoelectric resonator using radial vibration and length expanding/contracting vibration of the prior art. That is, in the case of the length bending vibration, the resonance frequency is proportional to the width of the device and the length of the device, as described above. Therefore, the piezoelectric resonator can be reduced in size. According to this preferred embodiment, a piezoelectric resonator with a resonance frequency of about 450 kHz can be formed by use of the piezoelectric member 2 having a length of approximately 1.8 mm and a width of approximately 0.5 mm. As described above, in the case of a piezoelectric resonator utilizing length expanding/contracting vibration, a piezoelectric member made of the same piezoelectric material needs to have a length of about 4.0 mm to attain a resonance frequency of about 450 kHz.

Moreover, in the piezoelectric device 41 which utilizes the piezoelectric longitudinal effect, the bandwidth can be increased compared to a piezoelectric device utilizing the piezoelectric transverse effect. Moreover, the piezoelectric resonator is a lamination type piezoelectric resonator in which the internal electrodes 43 and 44 and the piezoelectric layers are laminated to each other, respectively. Thus, the piezoelectric device 41 is advantageous in that the design flexibility for the electrostatic capacity is greatly improved.

In addition, in this preferred embodiment, the inactive layers 48 and 49 (see FIG. 15) are also arranged on both ends in the longitudinal direction of the portion of the piezoelectric member in which the first and second internal electrodes 43 and 44 and the piezoelectric layers are laminated to each other. Accordingly, the bandwidth can be increased due to the presence of the inactive layers 48 and 49 similarly to the first preferred embodiment.

Furthermore, in the piezoelectric device 41 of the second preferred embodiment, the first and second external electrodes 45 and 46 are disposed on the upper surface of the piezoelectric member 42. Therefore, the piezoelectric device 41 can be mounted onto a substrate by the face-down bonding system similarly to the piezoelectric device 1 of the first preferred embodiment.

Also, the vibration device of the second preferred embodiment is a bimorph type device of which the first and second piezoelectric regions are driven 180° out-of-phase with each other. Thus, the bandwidth can be increased compared to a unimorph type piezoelectric device.

The piezoelectric device 41 of this preferred embodiment can be fixed to a substrate without the bending vibration substantially perpendicular to the longitudinal direction being disturbed by providing holding portions nearly at the nodes of the vibration, similarly to the piezoelectric device 1 of the first preferred embodiment.

To excite the bending vibration substantially perpendicular to the longitudinal direction in the bimorph type vibration device, the first and second piezoelectric regions extending in the longitudinal direction must be driven 180° out-of-phase with each other. The direction of expanding/contracting strain of the piezoelectric member is determined by the relationship between the direction of polarization and the direction of an applied electric field. In this preferred embodiment, the polarization directions of the first and second piezoelectric regions between first and second internal electrodes 43 and 44 are opposite to each other. Thus, the piezoelectric device 41 of this preferred embodiment is configured such that when electric fields having the same electric-line direction are applied to the first and second piezoelectric regions of a piezoelectric layer, the first and second piezoelectric regions are driven 180° out-of-phase with each other. Accordingly, all of the first piezoelectric regions and all of the second piezoelectric regions of the respective piezoelectric layers are connected in parallel to each other. Therefore, the capacity of the piezoelectric device can be significantly improved. In other words, the number of electrodes necessary to achieve a desired capacity can be reduced, and thereby, the manufacturing cost can be reduced.

Figure 16A:
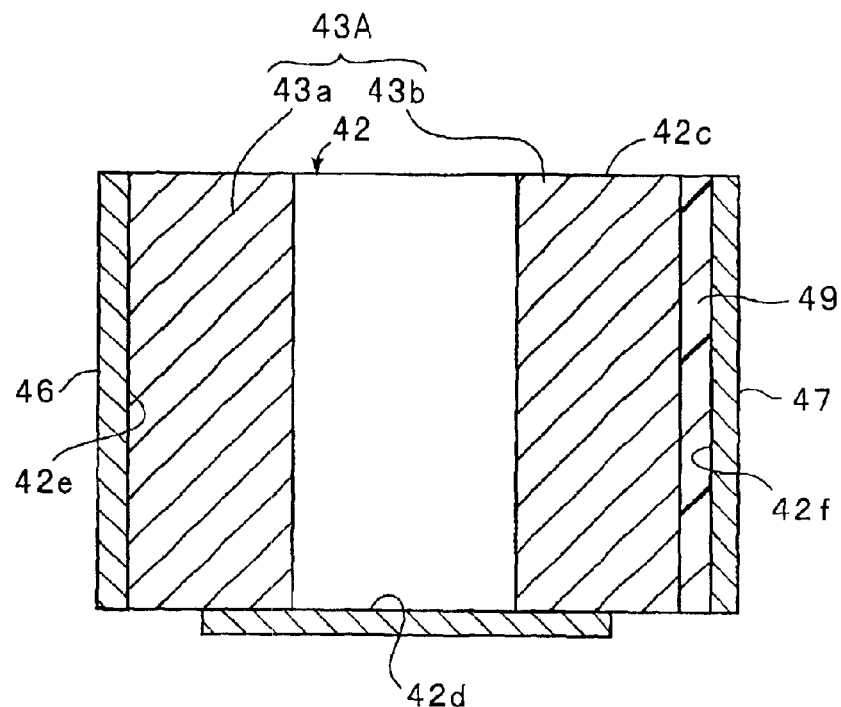
FIG. 16A is a transverse cross-sectional view of the portion of a modification of the piezoelectric member of the second preferred embodiment in which a first internal electrode is disposed.
Figure 16B:
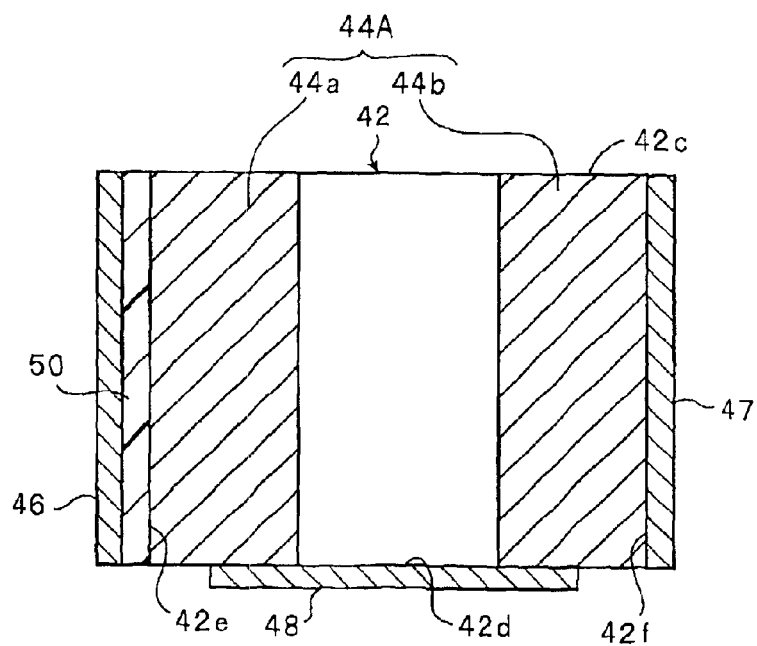
FIG. 16B is a transverse cross-sectional view of the portion of the modification of the piezoelectric member of the second preferred embodiment in which a second internal electrode is disposed.

FIGS. 16A and 16B illustrate modifications of the piezoelectric device of the second preferred embodiment.

In the piezoelectric device 41, the first and second external electrodes 46 and 47 are disposed on the upper surface of the piezoelectric member 42. That is, the external electrodes 46 and 47 are disposed on one side of the piezoelectric member 42 while they are separated from each other via a predetermined gap. As shown in the modifications of FIG. 16, the first and second external electrodes may be disposed on different surfaces. FIG. 16A is a transverse cross-sectional view showing the portion of the piezoelectric member in which an internal electrode 34A is formed as a modification of the first internal electrode 43. FIG. 16B is a transverse cross-sectional view showing the portion of the piezoelectric member in which an internal electrode 44A is provided as a modification of the second internal electrode.

In the modifications, a first internal electrode 43A includes the first divided internal electrodes 43a and 43b, and a second internal electrode 44A includes the first and second internal electrodes 44a and 44b, as in the second preferred embodiment. However, the first and second divided internal electrodes 43a, 43b, 44a, and 44b are arranged so as to extend to the upper surface 42c and the lower surface 42d of the piezoelectric member 42, respectively. The portion of the piezoelectric member 42 in which the first divided internal electrodes 43a and 44a are opposed to each other constitutes the fist piezoelectric region. On the other hand, the second divided internal electrodes 43b and 44b are arranged so as to extend to the side surface 42f. The portion of the piezoelectric member 42 through which the second divided internal electrodes 43b and 44b are overlapped with each other constitutes the second piezoelectric region.

On the other hand, the first and second external electrodes 46 and 47 are separately disposed onto the first side surface 42e and the second side surface 42f of the piezoelectric member 42.

The second divided internal electrode 43b is separated from the second external electrode 47 via an insulation layer 49 so as not to be electrically connected to the second external electrode 47. Moreover, the first divided internal electrode 44a of the second internal electrode 44A is insulated from the first external electrode 46 via an insulation layer 50.

As described above, to electrically interrupt the first external electrode 46 from the first divided internal electrode 44a of the second internal electrode 44 and moreover, the second external electrode 47 from the second divided internal electrode 43b of the first internal electrode 43, the insulation layers 49 and 50 are provided, respectively. Thereby, the piezoelectric device 41 can be operated by applying an AC voltage across the external electrodes 46 and 47, similarly to the piezoelectric device 41 of the second preferred embodiment.

To form the insulation layers 49 and 50, electrically insulating paste may be applied onto the side surfaces of the piezoelectric member 42 so as to extend in the vertical direction. Thereafter, the first and second external electrodes 46 and 47 are formed.

Figure 17A:
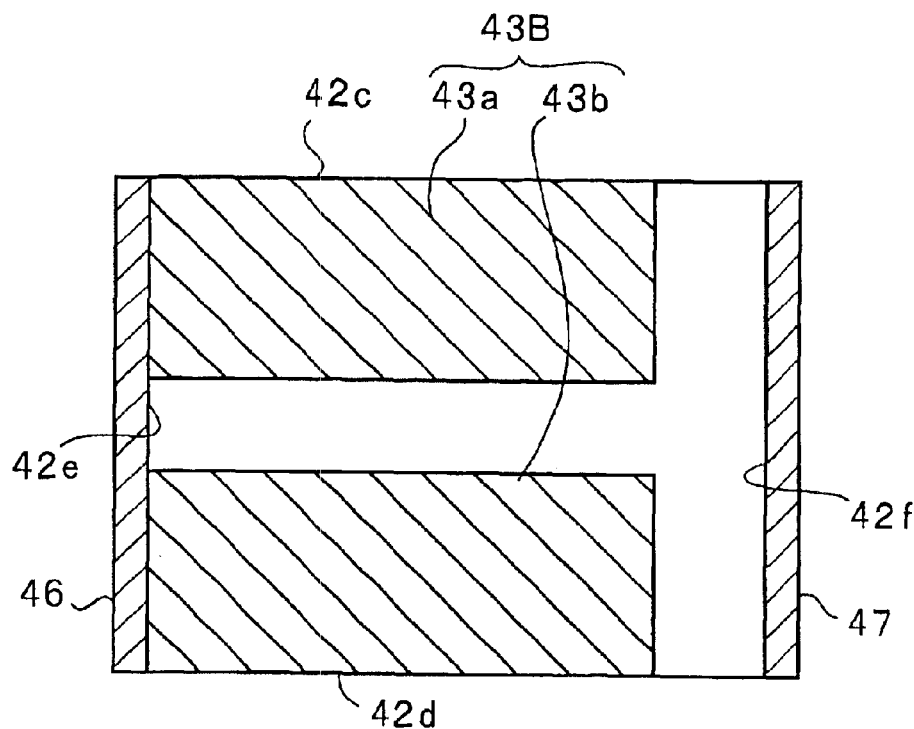
FIG. 17A is a transverse cross-sectional view of the portion of another modification of the piezoelectric member of the second preferred embodiment in which a first internal electrode is disposed.
Figure 17B:
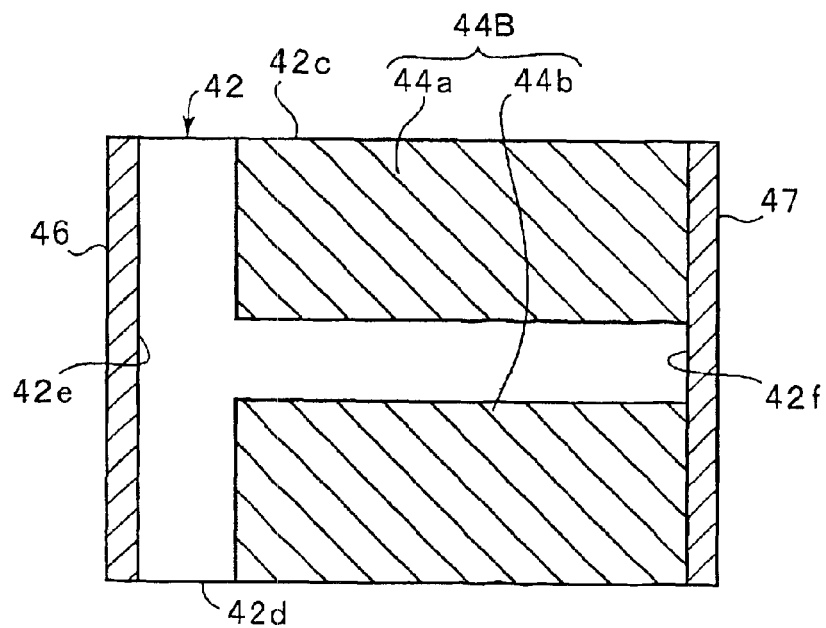
FIG. 17B is a transverse cross-sectional view of the portion of the modification of the piezoelectric member of the second preferred embodiment in which a second internal electrode is disposed.

FIGS. 17A and 17B are transverse cross-sectional views showing another modification of the piezoelectric device 41 of the second preferred embodiment. FIG. 17A is a transverse cross-sectional view of the portion of the piezoelectric member 42 in which a first internal electrode 43B is provided. FIG. 17B is a transverse cross-sectional view of the portion of the piezoelectric member 42 in which the second internal electrode 44B is disposed.

In this modification, each of the first and second internal electrodes 43B and 44B is arranged so as to be divided in upper and lower portions, respectively. For example, the first internal electrode 43B comprises the first divided internal electrode 43a and the second divided internal electrode 43b. The first divided internal electrode 43a and the second divided internal electrode 43b are separated from each other via a predetermined gap formed in the transverse direction.

Moreover, the first and second divided internal electrodes 43a and 43b of the first internal electrode 43B extend to the first side surface 32e, not to the second side surface 42f, respectively.

To the contrary, the first and second divided internal electrodes 44a and 44b of the second internal electrode 44B extend to the second side surface 42f, not to the first side surface 42e.

Accordingly, the piezoelectric device 41 can be operated by forming the first and second external electrodes 46 and 47 on the first and second side surfaces 42e and 42f.

The polarization structure in the piezoelectric member 42 in the modification shown in FIG. 17 is preferably the same as that of the second preferred embodiment except that the first and second piezoelectric regions are divided in the transverse direction of the piezoelectric member 42.

Accordingly, the piezoelectric member 42 can be excited to carry out the bending vibration in which the member 42 is vibrated so as to be deflected in the vertical direction, substantially perpendicularly to the longitudinal direction by applying an AC voltage through the first and second external electrodes 46 and 47.

In the second modification, the first divided internal electrode 43a is electrically connected to the second divided internal electrode 43b via the first external electrode 46, and the first internal electrode 44a is electrically connected to the second divided internal electrode 44b via the second external electrode 47. Therefore, the relay electrodes 48 are unnecessary for the piezoelectric device 41 of this preferred embodiment.

Figure 18:
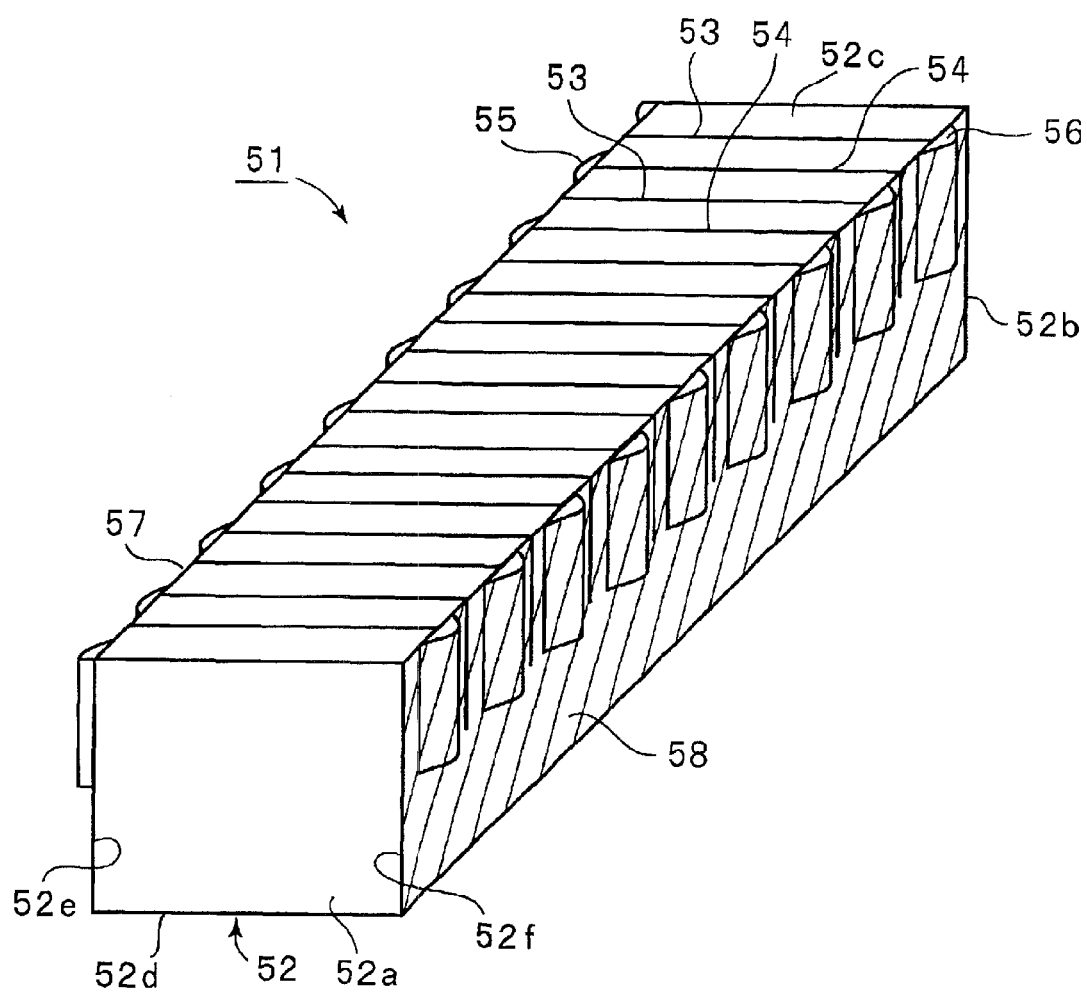
FIG. 18 is a perspective view showing the appearance of a piezoelectric device according to a third preferred embodiment of the present invention.

FIG. 18 is a perspective view of a piezoelectric device according to a third preferred embodiment of the present invention. A piezoelectric device 51 of the third preferred embodiment is a unimorph type piezoelectric vibration device.

The piezoelectric device 51 includes a piezoelectric member 52 having a substantially parallelepiped shape. The piezoelectric member 52 may be made of an appropriate piezoelectric ceramic such as a lead titanate zirconate type ceramic or other suitable material.

The piezoelectric member 52 has first and second end surfaces 52a and 52b, an upper surface 52c, a lower surface 52d, and first and second side surfaces 52e and 52f.

Figure 19:
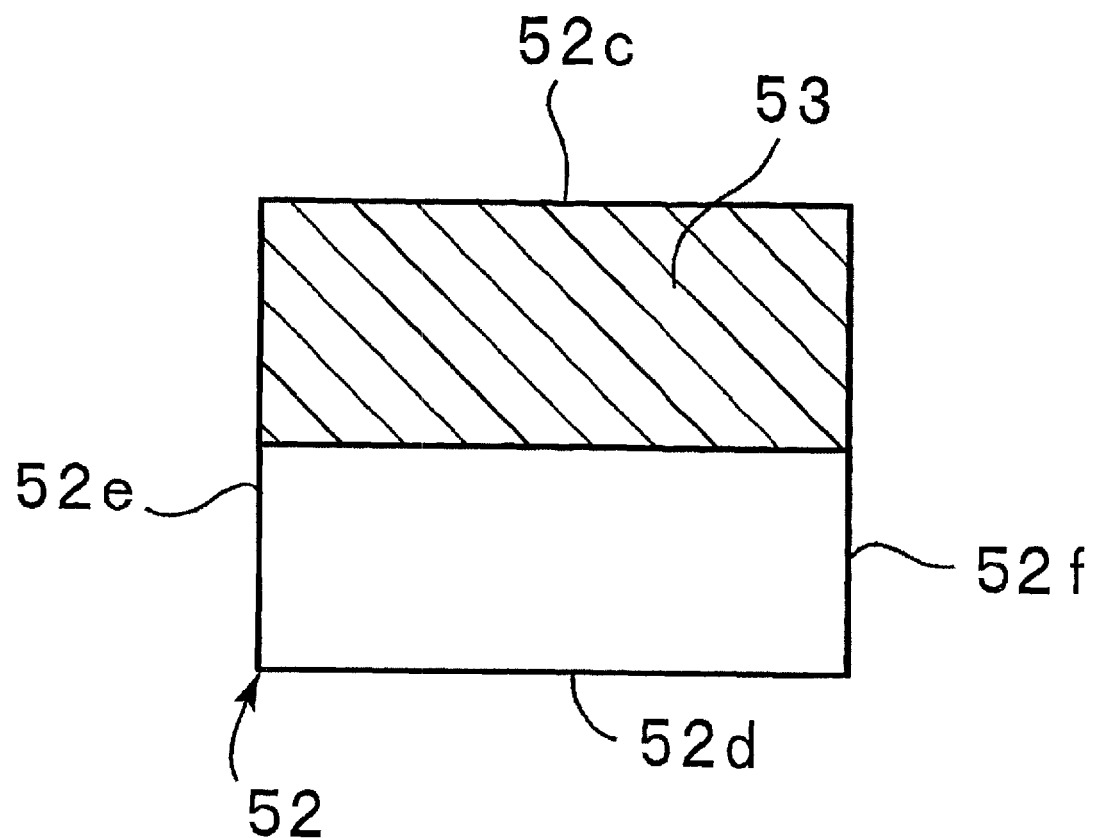
FIG. 19 is a transverse cross-sectional view of a first internal electrode used in the third preferred embodiment.

In the piezoelectric member 52, first and second internal electrodes 53 and 54 extending substantially perpendicularly to the longitudinal direction of the member 52 are alternately arranged in the longitudinal direction of the piezoelectric member 52 so as to be overlapped with each other via piezoelectric layers, respectively. FIG. 19 is a transverse cross-sectional view showing the portion of the piezoelectric member 52 in which a first internal electrode 53 is disposed. The second internal electrode 54 is formed in a manner similar to that for the first internal electrode 53. The upper edges of the internal electrodes 53 and 54 are exposed to an upper surface 52c of the piezoelectric member 52 and to the upper portions from the center in the longitudinal direction of the first and second side surfaces 52e and 52f. That is, the internal electrodes 53 and 54 are arranged so as to occupy the upper half of the transverse cross-section of the piezoelectric member 52.

Accordingly, the piezoelectric region in which the internal electrodes 53 and 54 are laminated to each other occupies the upper portion of the piezoelectric member 52. No internal electrodes are disposed in the lower portion of the piezoelectric member 52.

In other words, the first and second internal electrodes are unevenly distributed in the upper portion of the piezoelectric member.

The piezoelectric layer sandwiched between the first and second internal electrodes 53 and 54 is polarized in the longitudinal direction. Piezoelectric layers which are adjacent to each other in the longitudinal direction are polarized in the opposite polarization directions in the longitudinal direction.

On the other hand, a plurality of insulation layers 55 and 56 are disposed on side surfaces 52e and 52f of the piezoelectric member 52. A plurality of the insulation layers 55 are arranged so as to cover the portions of the second internal electrodes 54 which are exposed on the side-surface 52e. On the other hand, a plurality of the insulation layers 56 are arranged so as to cover the portions of the first internal electrodes 53 which are exposed onto the side surface 52f.

First and second external electrodes 57 and 58 are disposed on the first and second side surfaces 52e and 52f, respectively. The first external electrode 57 is electrically connected to the first internal electrodes 53. The second external electrode 58 is electrically connected to the second internal electrodes 54. That is, the first and second external electrodes 57 and 58 are formed after the above-described insulation layers 55 and 56 are formed.

Accordingly, by applying an AC voltage across the first and second external electrodes 57 and 58, an expanding/contracting-driving force is generated by vibration in the longitudinal direction by use of a piezoelectric longitudinal effect. In this case, the piezoelectric region lying in the lower portion of the piezoelectric member 52 acts as a constraint layer for the piezoelectric region in the upper portion of the piezoelectric member 52. Thus, the center of the piezoelectric device 51 has a certain vibration form. That is, the device 51 is vibrated so as to be deflected upward and downward. In particular, the bending vibration in which the entire portion extending in the longitudinal direction of the piezoelectric device 52 is bending-vibrated substantially perpendicularly to the longitudinal direction is excited.

As described above, according to the piezoelectric device of various preferred embodiments of the present invention, the unimorph type piezoelectric vibration device which includes the piezoelectric region unevenly distributed on the upper surface 52c side as its driving region in the piezoelectric member 52 longer in one direction can be formed.

In this preferred embodiment, the region in the upper half of the piezoelectric member 52 functions as a drive region. On the other hand, a unimorph type piezoelectric device in which the upper half of the piezoelectric member 52 functions as a drive region may be formed by providing first and second internal electrodes 53A and 54A shown in FIGS. 20A and 20B.

Figure 20A:
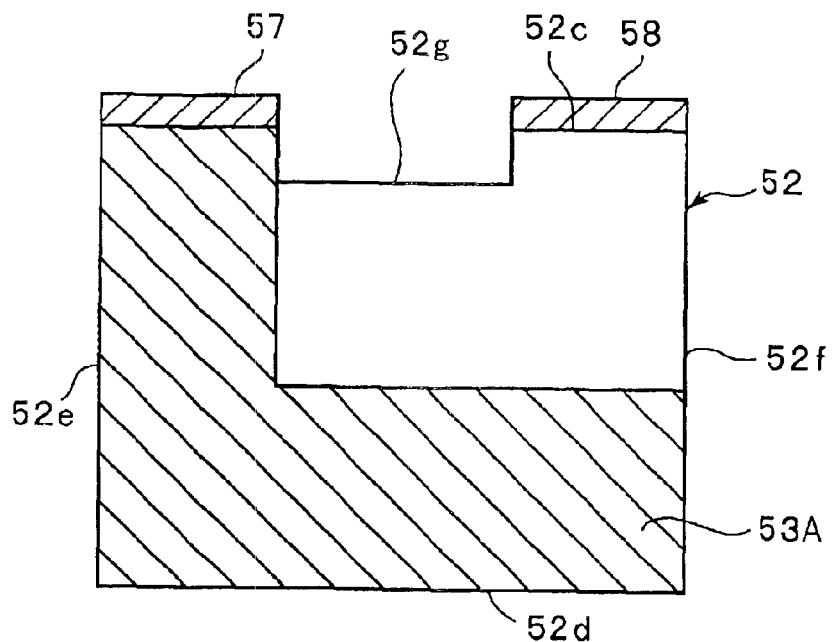
FIG. 20A is a transverse cross-sectional view of the portion of a modification of the piezoelectric device of the third preferred embodiment in which a first internal electrode is disposed.
Figure 20B:
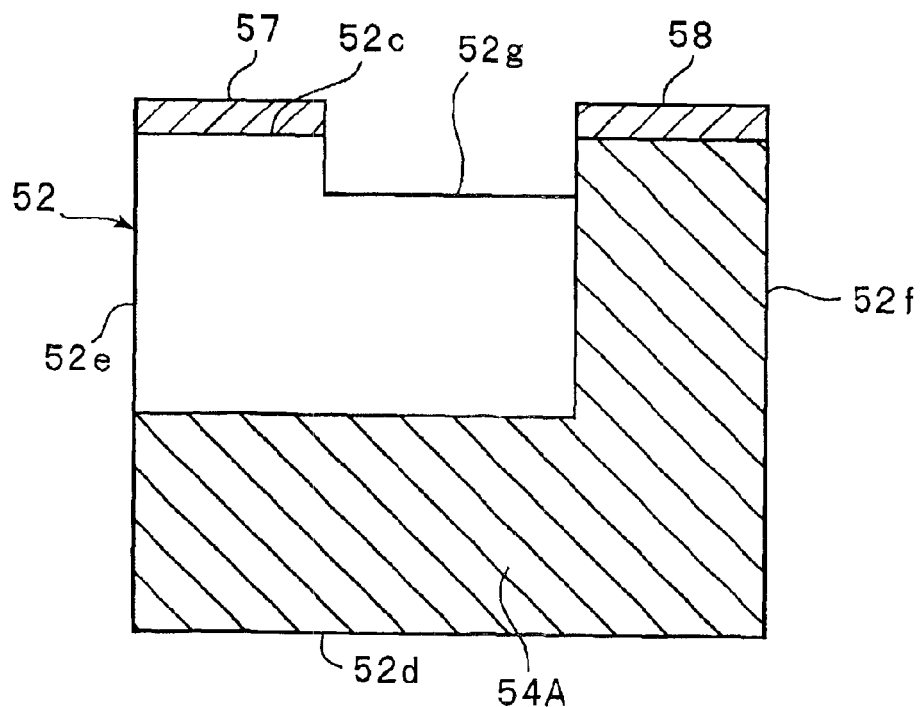
FIG. 20B is a transverse cross-sectional view of the portion of the modification of the piezoelectric member of the second preferred embodiment in which a second internal electrode is disposed.

The first and second internal electrodes 53A and 54A shown in FIGS. 20A and 20B which lie in the lower half of a transverse cross-section of the piezoelectric member 52 are overlapped with each other via the piezoelectric layer.

The internal electrodes 53 and 54 are exposed on the upper sides of the side surfaces 52e and 52f, and are electrically connected to the first and second external electrodes 57 and 58. Moreover, a groove 52g is formed in the upper surface 52c of the piezoelectric member 52 so as to elongate in the center and in the longitudinal direction of the upper surface 52c, similarly to the first preferred embodiment. The first and second external electrodes 57 and 58 are disposed on both sides of the groove 52g. In this case, an AC voltage is applied across the first and second external electrodes 57 and 58, and thereby, the piezoelectric device can be driven as a unimorph type vibration device similarly to the piezoelectric device 51.

In the case in which the unimorph type vibration device is provided, the drive region is not limited to the upper-half region or lower-half region of the piezoelectric member longer in one direction.

Figure 21A:
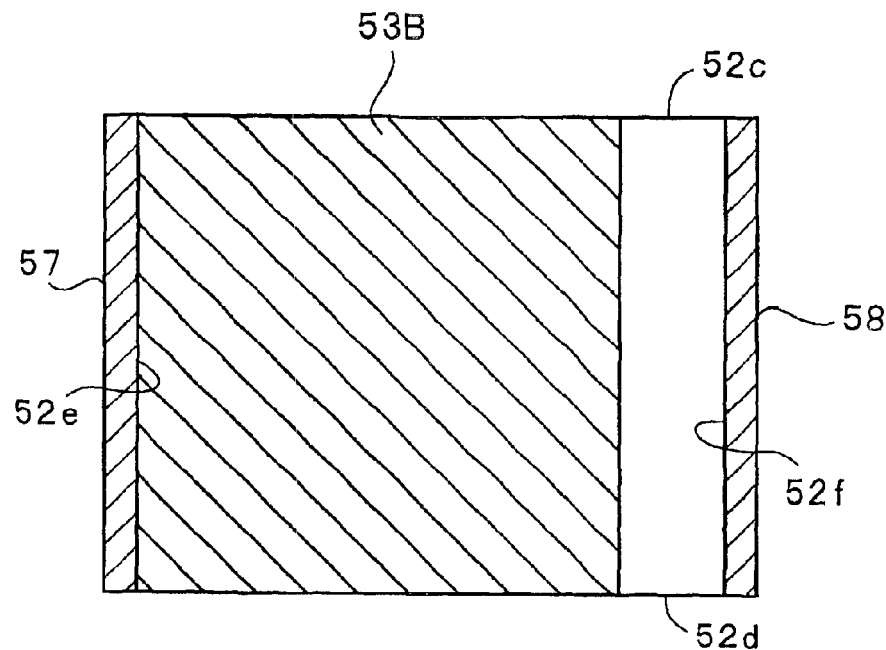
FIG. 21A is a transverse cross-sectional view of the portion of another modification of the piezoelectric device of the third preferred embodiment in which a first internal electrode is disposed.
Figure 21B:
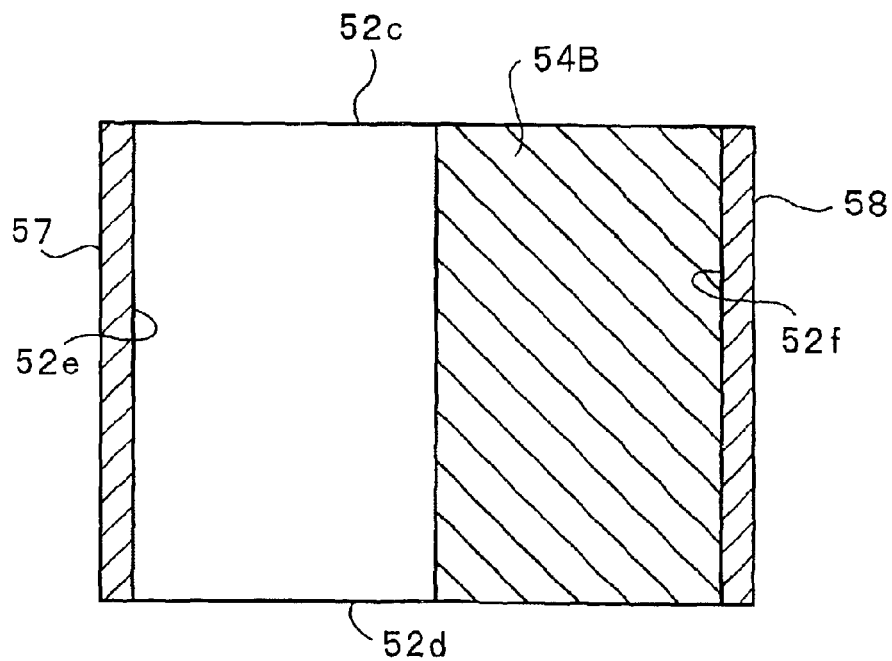
FIG. 21B is a transverse cross-sectional view of the portion of the modification of the piezoelectric member of the third preferred embodiment in which a second internal electrode is disposed.

For example, the unimorph type vibration device may be provided by forming a drive region via which the first internal electrode and the second internal electrode are overlapped with each other so that the drive region is unevenly distributed on the side surface 52f side. The first internal electrode 53B shown in FIG. 21A and the second internal electrode 54B shown in FIG. 21B are overlapped with each other in a transverse cross-section of the piezoelectric member 52 so that the drive region is unevenly distributed on the second side surface 52f side thereof. Thus, since the drive region is unevenly distributed on the side surface 52f side, the right-half region of the piezoelectric member 52 is excited in a length-expanding/contracting vibration mode utilizing the piezoelectric longitudinal effect. Thus, similarly to the piezoelectric device 61 of the third preferred embodiment, the piezoelectric device defines a unimorph type vibration device in which the right-half of the piezoelectric member 52 is excited in the length-expanding/contracting vibration mode utilizing the piezoelectric longitudinal effect.

In this case, the first internal electrode 53B is extended out to the first side surface 52e, while the second internal electrode 54B is extended out to the second side-face 52f. Accordingly, the first and second external electrodes 57 and 58 are disposed on the side surfaces 52e and 52f, respectively.

As described above, when the unimorph type piezoelectric device 51 is produced, the drive region may be constructed so as to be unevenly distributed on the upper surface side, on the lower surface side, or on either one of the first and second side surface sides.

In the first, second, and third preferred embodiments, the piezoelectric resonators are explained as an example. The piezoelectric device of the present invention can be applied to a piezoelectric displacement device such as an actuator or other suitable apparatus.

Figure 22:
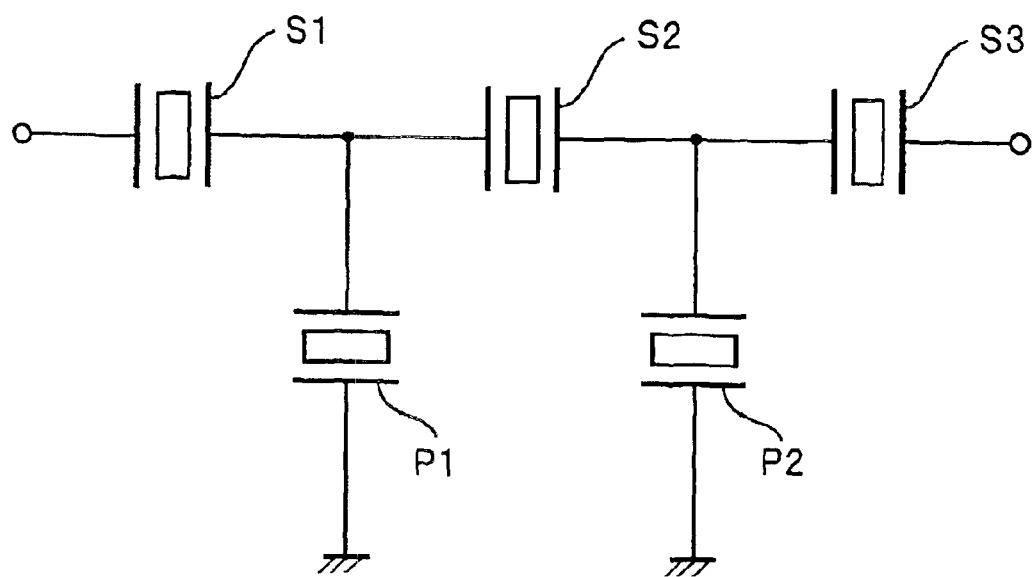
FIG. 22 shows a circuit configuration of a ladder type filter.

In the case in which the piezoelectric device of preferred embodiments of the present invention is used as a piezoelectric resonator, a plurality of the piezoelectric resonators are electrically connected to define a ladder type circuit configuration. Thus, a ladder type filter is provided. That is, a plurality of the piezoelectric resonators may be connected so as to include a ladder type circuit configuration as shown in the circuit diagram of FIG. 22, whereby a ladder type filter is provided. In this case, the electrostatic capacitances of series arm resonators S1, S2, and S3 are different from those of parallel arm resonators P1 and P2. In the piezoelectric device according to various preferred embodiments of the present invention, the design flexibility for the electrostatic capacitance is very high. Thus, such parallel arm resonators and series arm resonators can be easily formed.

With the piezoelectric device which is a lamination type piezoelectric device according to the first preferred embodiment of the present invention, the vibration in which the piezoelectric member is bent substantially perpendicularly to the longitudinal direction of the piezoelectric member by utilization of a piezoelectric longitudinal effect is excited. Thus, when the piezoelectric device is used as a piezoelectric resonator, the bandwidth can be increased. Moreover, since the resonance frequency does not depend on the length of the piezoelectric member, the piezoelectric device can be reduced in size. That is, a piezoelectric resonator having a wide bandwidth and a small size can be provided. Moreover, the piezoelectric device has a lamination structure. Therefore, a piezoelectric resonator having a high design flexibility for the electrostatic capacity and a desired electrostatic capacitance can be easily provided.

In the piezoelectric device according to the second preferred embodiment of the present invention, the first piezoelectric region lying on the first side surface side or on the upper surface side with respect to the center of the width direction of the piezoelectric member being configured so that a expanding/contracting driving-force is generated 180° out-of-phase with each other, utilizing a piezoelectric longitudinal effect, whereby the bending vibration in which the entire portion in the longitudinal direction of the piezoelectric member is bent substantially perpendicularly to the longitudinal direction of the piezoelectric member. Thus, similar to the first preferred embodiment of the present invention, when the piezoelectric device is used as a piezoelectric resonator, the bandwidth is greatly increased, and the reduction in size of the device is achieved. Moreover, the design flexibility for the electrostatic capacity is high, and the bandwidth is even more increased compared to a unimorph type vibration device.

In the piezoelectric device according to the second preferred embodiment of the present invention, the first and second external electrodes are arranged on the outer surface of the piezoelectric member so as to be electrically connected to the first and second divided internal electrodes. Thus, the piezoelectric device can be easily driven by applying a drive voltage via the first and second external electrode disposed on the outer surface of the piezoelectric member for operation of the device. Especially, when the first and second external electrodes are disposed on the upper surface or the lower face, the piezoelectric device can be easily mounted onto a substrate or other suitable mounting surface. Thus, the manufacturing cost of the piezoelectric device is greatly reduced.

In the case in which the groove is formed between the first and second external electrodes, the first and second external electrodes can be securely prevented from short-circuiting. The first and second external electrodes can be easily separated and provided by forming the groove after the external electrodes are formed on the entire surface.

In the piezoelectric device according to the second preferred embodiment of the present invention, the first piezoelectric region and the second piezoelectric region are polarized in the opposite polarization directions in the longitudinal direction of the piezoelectric member. In the case in which the corresponding piezoelectric regions of piezoelectric layers which are adjacent to each other in the longitudinal direction of the piezoelectric member are polarized in the opposite polarization directions, the piezoelectric device can be operated as a bimorph type vibration device by applying electric fields in the same field direction to the first and second piezoelectric region of each piezoelectric layer. Thus, the first and second piezoelectric regions of each piezoelectric layer are connected in parallel to each other, the capacity of the piezoelectric device can be easily increased. Thus, the number of internal electrodes required to attain a large capacity for the piezoelectric device can be reduced.

In the piezoelectric device according to the third preferred embodiment of the present invention, the first internal electrode and the second internal electrode are unevenly distributed on the side surface side, on the upper surface side, or on the lower surface side, and thereby, in the piezoelectric region having the first and second internal electrodes, expanding/contracting vibration is excited in the longitudinal direction of the piezoelectric member using the piezoelectric longitudinal effect. Accordingly, the piezoelectric region functions as a drive region, and the other region functions as a constraint region. Thus, a unimorph type piezoelectric device can be provided.

With this unimorph type piezoelectric device, the vibration in which the whole of the piezoelectric member in the longitudinal direction is bent substantially perpendicularly to the longitudinal direction of the piezoelectric member, utilizing the piezoelectric longitudinal effect is excited. Thus, the bandwidth is greatly increased, and the size of the piezoelectric device is significantly reduced. Moreover, the piezoelectric device has the unimorph structure in which a drive force is generated only in a partial region of the piezoelectric member. Thus, the bandwidth is greatly reduced.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A bimorph piezoelectric device comprising:
   a piezoelectric member having a first end surface and a second end surface arranged on two ends in the longitudinal direction thereof, an upper surface and a lower surface each extending between the first end surface and the second end surface, and a first side surface and a second side surface; and
   a plurality of first internal electrodes and a plurality of second internal electrodes being arranged substantially perpendicularly relative to the longitudinal direction of the piezoelectric member, being overlapped with each other via piezoelectric layers in the longitudinal direction, respectively, and being alternately arranged In the longitudinal direction; wherein each of the first internal electrodes having a first divided internal electrode and a second divided internal electrode divided substantially perpendicularly relative to the longitudinal direction of the piezoelectric member;

each of the first internal electrodes has the same first shape and configuration and each of the second internal electrodes has the same second shape and configuration that is different from the first shape and configuration; and the piezoelectric member hiving a first piezoelectric region located on one of the first side surface side and on the upper surface side and a second piezoelectric region located on one of the second side surface side and on the lower surface side with respect to the center of the width direction of the piezoelectric member, the first and second piezoelectric regions being configured so that expanding/contracting driving-forces are generated 180° out-of-phase with each other, utilizing a piezoelectric longitudinal effect, whereby the bending vibration in which the entire portion in the longitudinal direction of the piezoelectric member is bent substantially perpendicularly relative to the longitudinal direction of the piezoelectric member.

2. A piezoelectric device according to claim 1, wherein adjacent piezoelectric layers in the longitudinal direction are polarized in the longitudinal direction of the piezoelectric member and in different polarization directions, and the first piezoelectric region and the second piezoelectric region are polarized in the same polarization direction in each of the piezoelectric layers, such that electric fields can be applied to the first piezoelectric region and the second piezoelectric region in the different electric-field directions.

3. A piezoelectric device according to claim 2, wherein the device further comprises first and second external electrodes disposed on the outer surface of the piezoelectric member so as to be electrically connected to the first and second divided internal electrodes.

4. A piezoelectric device according to claim 3, wherein the first and second external electrodes are disposed on one of the upper surface and the lower surface of the piezoelectric member.

5. A piezoelectric device according to claim 4, wherein the device further comprises a groove located between the first and second external electrodes.

6. A piezoelectric device according to claim 1, wherein the first piezoelectric region and the second piezoelectric region are polarized in the opposite directions in the longitudinal direction of the piezoelectric member, and the corresponding piezoelectric regions of piezoelectric layers which are adjacent to each other in the longitudinal direction are polarized in the opposite polarization directions in the longitudinal direction, such that electric fields in the same direction are applied to the first piezoelectric region and the second piezoelectric region of each piezoelectric layer.

7. A piezoelectric device according to claim 6, wherein the device further comprises a first external electrode disposed on the outer surface of the piezoelectric member so as to be electrically connected to the first internal electrodes, and a second external electrode disposed on the outer surface of the piezoelectric member so as to be electrically connected to the second internal electrodes.

8. A piezoelectric device according to claim 6, wherein one of the first and second internal electrodes have a first divided internal electrode arranged in the first piezoelectric region and a second divided internal electrode arranged in the second piezoelectric region, respectively, the first and second divided electrodes being electrically connected to each other.

9. A unimorph piezoelectric device piezoelectric device comprising:

a piezoelectric member having a first end surface and a second end surface arranged on two ends in the longitudinal direction thereof, an upper surface and a lower surface each extending between the first end surface and the second end surface, and a first side surface and a second side surface;

a plurality of the first internal electrodes and a plurality of the second internal electrodes being arranged substantially perpendicularly relative to the longitudinal direction in the piezoelectric member, and being arranged so as to be overlapped with each other via piezoelectric layers in the longitudinal direction, respectively, each of the first internal electrodes having a first shape and configuration and each of the second internal electrodes having a second shape and configuration that is different from the first shape and configuration; and pairs of the piezoelectric layers which are adjacent to each other in the longitudinal direction being polarized in opposite directions, the first internal electrode and the second internal electrode being arranged so as to be unevenly distributed on one of the side surface side, the upper surface side, and the lower surface side, the piezoelectric region having the first and second internal electrodes disposed therein being configured so as to generate expanding/contracting-drive forces in the longitudinal direction utilizing a piezoelectric longitudinal effect, whereby the bending vibration in which an entire portion in the longitudinal direction of the piezoelectric member is bent substantially perpendicularly to the longitudinal direction thereof is excited.

10. A piezoelectric device according to claim 9, wherein an inactive layer to which no electric field is applied at driving is arranged in at least one end in the longitudinal direction of the piezoelectric member.

11. A piezoelectric device according to claim 9, wherein the device further comprises a holding portion arranged in the vicinity of a node of the bending vibration of the piezoelectric member and fixed to the piezoelectric member.

12. A piezoelectric device according to claim 11, wherein the holding portion is arranged near the node in the direction passing through the node of the piezoelectric member and being substantially perpendicular to the longitudinal direction of the piezoelectric member.

13. A ladder type filter comprising:

a substrate; and a plurality of the piezoelectric devices according to claim 1 disposed on the substrate, the plurality of the piezoelectric devices being electrically connected so as to define a ladder type circuit configuration.

14. A ladder type filter comprising:

a substrate; and a plurality of the piezoelectric devices according to claim 9 disposed on the substrate, the plurality of the piezoelectric devices being electrically connected so as to define a ladder type circuit configuration.

* * * * *